United States Patent
Liu et al.

(10) Patent No.: US 11,756,970 B2
(45) Date of Patent: Sep. 12, 2023

(54) METAL GRID STRUCTURE TO IMPROVE IMAGE SENSOR PERFORMANCE

(71) Applicant: Taiwan Semiconductor Manufacturing Co., Ltd., Hsinchu (TW)

(72) Inventors: Ming Chyi Liu, Hsinchu (TW); Jiech-Fun Lu, Madou Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 140 days.

(21) Appl. No.: 17/328,036

(22) Filed: May 24, 2021

(65) Prior Publication Data

US 2022/0285412 A1  Sep. 8, 2022

Related U.S. Application Data

(60) Provisional application No. 63/157,463, filed on Mar. 5, 2021.

(51) Int. Cl.
*H01L 27/146* (2006.01)
*H01L 31/0232* (2014.01)

(52) U.S. Cl.
CPC .. *H01L 27/14605* (2013.01); *H01L 27/14621* (2013.01); *H01L 27/14627* (2013.01); *H01L 27/14685* (2013.01); *H01L 31/0232* (2013.01)

(58) Field of Classification Search
None
See application file for complete search history.

(56) References Cited

U.S. PATENT DOCUMENTS

| | | | |
|---|---|---|---|
| 2008/0251821 A1* | 10/2008 | Ko | H01L 27/14609 257/292 |
| 2010/0263913 A1* | 10/2010 | Daubenspeck | H01L 24/03 174/250 |
| 2011/0024866 A1* | 2/2011 | Tseng | H01L 27/1464 257/E31.113 |
| 2012/0113304 A1* | 5/2012 | Chen | H01L 27/14623 348/E5.091 |
| 2017/0278881 A1 | 9/2017 | Hsu et al. | |
| 2018/0040656 A1* | 2/2018 | Jang | H01L 27/14621 |
| 2019/0206917 A1 | 7/2019 | Nakajiki et al. | |
| 2019/0221597 A1 | 7/2019 | Noh et al. | |
| 2020/0075643 A1 | 3/2020 | Han et al. | |
| 2020/0119072 A1 | 4/2020 | Lim | |
| 2021/0327930 A1* | 10/2021 | Lim | H01L 27/14636 |

* cited by examiner

*Primary Examiner* — Ali Naraghi
(74) *Attorney, Agent, or Firm* — Eschweiler & Potashnik, LLC

(57) ABSTRACT

Various embodiments of the present disclosure are directed towards an image sensor. The image sensor comprises a plurality of photodetectors disposed within a substrate. A metal grid layer is disposed over the substrate. The metal grid layer comprises a metal grid structure overlying a central pixel region of the substrate. The metal grid layer continuously extends from the central pixel region to a peripheral pixel region of the substrate that laterally encloses the central pixel region. An upper metal structure is disposed over the metal grid layer. The upper metal structure overlies the peripheral pixel region. The upper metal structure is laterally offset from the metal grid structure. A lower surface of the upper metal structure is disposed vertically over an upper surface of the metal grid structure.

20 Claims, 17 Drawing Sheets

METAL GRID STRUCTURE TO IMPROVE IMAGE SENSOR PERFORMANCE

REFERENCE TO RELATED APPLICATION

This Application claims the benefit of U.S. Provisional Application No. 63/157,463, filed on Mar. 5, 2021, the contents of which are hereby incorporated by reference in their entirety.

BACKGROUND

Many modern-day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
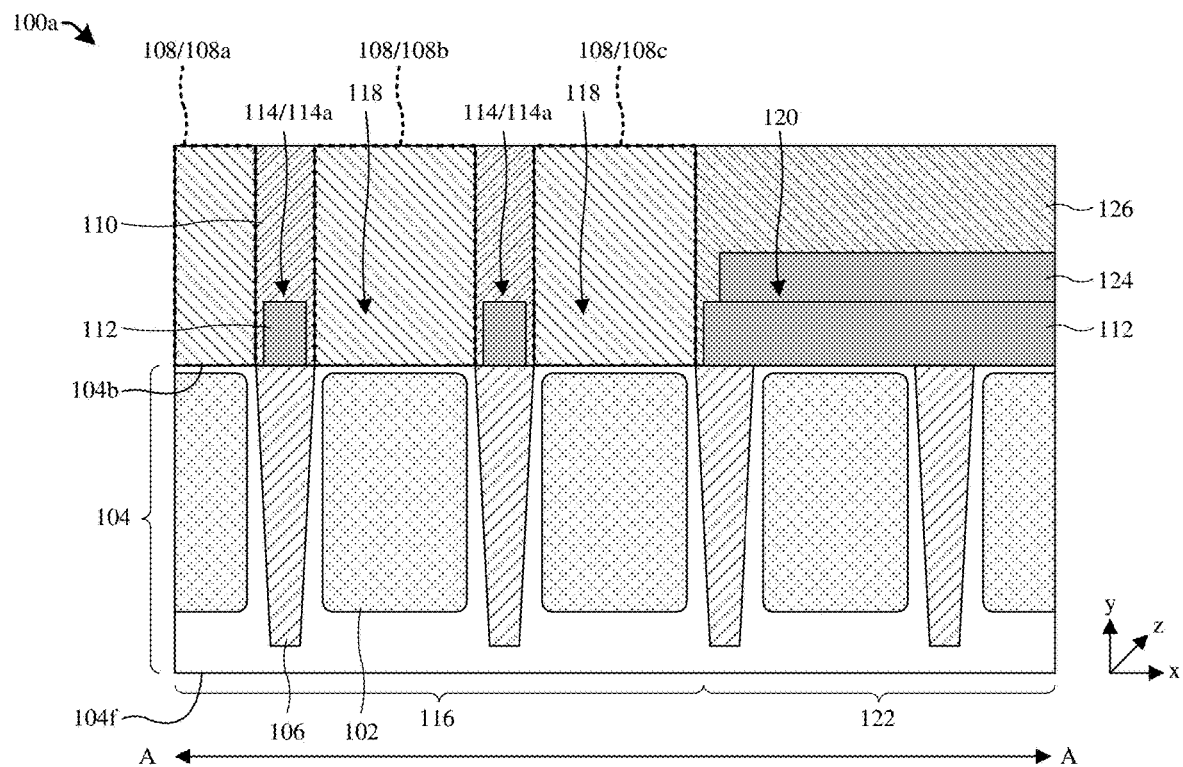
FIGS. 1A-1B illustrate various views of an image sensor having a metal grid structure that improves the quantum efficiency (QE) of a plurality of photodetectors.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a plurality of photodetectors disposed in a device region of a semiconductor substrate. A plurality of pixel devices (e.g., transfer transistors, source follower transistors, reset transistors, etc.) and an interconnect structure are disposed along a first surface (e.g., front-side surface) of the semiconductor substrate. An isolation structure (e.g., a deep trench isolation (DTI) structure) is disposed in/over a second surface (e.g., back-side surface) of the semiconductor substrate and is disposed laterally between adjacent photodetectors. The pixel devices may be electrically coupled to the photodetectors through the interconnect structure.

A metal grid structure is disposed along the second surface of the semiconductor substrate. The metal grid structure comprises a plurality of first elongated grid segments and a plurality of second elongated grid segments. The first elongated grid segments are arranged in parallel with one another and each extend in a first direction. The second elongated grid segments are arranged in parallel with one another and each extend in a second direction orthogonal to the first direction. The first elongated grid segments intersect the second elongated grid segments and define a plurality of grid openings that extend through the metal grid structure. Each grid opening directly overlies a corresponding photodetector in the plurality of photodetectors, and a plurality of light filters are disposed within the grid openings. The metal grid structure is configured to increase sensitivity (e.g., quantum efficiency (QE)) and reduce crosstalk between adjacent photodetectors.

In some embodiments, the metal grid structure may be formed by depositing a metal grid layer over the second surface of the semiconductor substrate. A masking layer is formed over the metal grid layer. A single etching process is performed according to the masking layer to define the plurality of first elongated grid segments and the plurality of second elongated grid segments, thereby defining the metal grid structure. The first elongated grid segments intersect the second elongated grid segments at a plurality of intersection points and define a plurality of grid openings that extend through the metal grid structure. However, after performing the single etching process according to the masking layer, remnants of the metal grid layer may extend from sidewalls of each first elongated grid segment to sidewalls of an adjacent second elongated grid segment at each intersection point. This results in the plurality of grid openings having a rectangular shape with rounded corners (e.g., a squircle-like shape) when viewed from above. The remnants of the metal grid structure may directly overlie a corresponding photodetector disposed within the semiconductor substrate, such that the remnants of the metal grid structure undesirably reflect incident light away from the corresponding photodetector. This, in part, may reduce the QE of the plurality of photodetectors, thereby decreasing a performance of the image sensor.

Accordingly, various embodiments of the present disclosure are directed towards an improved method for forming a metal grid structure that improves the QE of a plurality of photodetectors. The method includes forming a plurality of photodetectors within a semiconductor substrate and forming a metal grid structure over the semiconductor substrate. A process for forming the metal grid structure includes depositing a first metal layer over a surface of a substrate (e.g., a back-side surface of the semiconductor substrate) and depositing a second metal layer over the first metal layer. A first etching process is performed on the second metal layer according to a first masking layer to define a plurality of elongated metal segments arranged in parallel with one another and extending in a first direction. A second masking layer is formed over the plurality of elongated metal segments, such that the second masking layer comprises a plurality of elongated masking segments arranged in parallel with one another and extending in a second direction orthogonal to the first direction. A second etching process is then performed on the first metal layer according to the masking layer and the plurality of elongated metal segments, thereby defining a metal grid structure.

The metal grid structure comprises a plurality of first elongated grid segments extending in the first direction and a plurality of second elongated grid segments extending in the second direction. The first elongated grid segments intersect the second elongated grid segments and define a plurality of grid openings that extend through the metal grid structure. By virtue of the first metal layer being etched according to the masking layer and the plurality of elongated metal segments, the first and second elongated grid segments intersect each other at substantially right angles such that the grid openings are rectangular when viewed from above. Further, this prevents the presence of remnants of the first metal layer from extending between adjacent first and second elongated grid segments, thereby mitigating the reflection of incident light away from the photodetectors. Thus, a QE of the plurality of photodetectors may be increased.

Figure 1B:
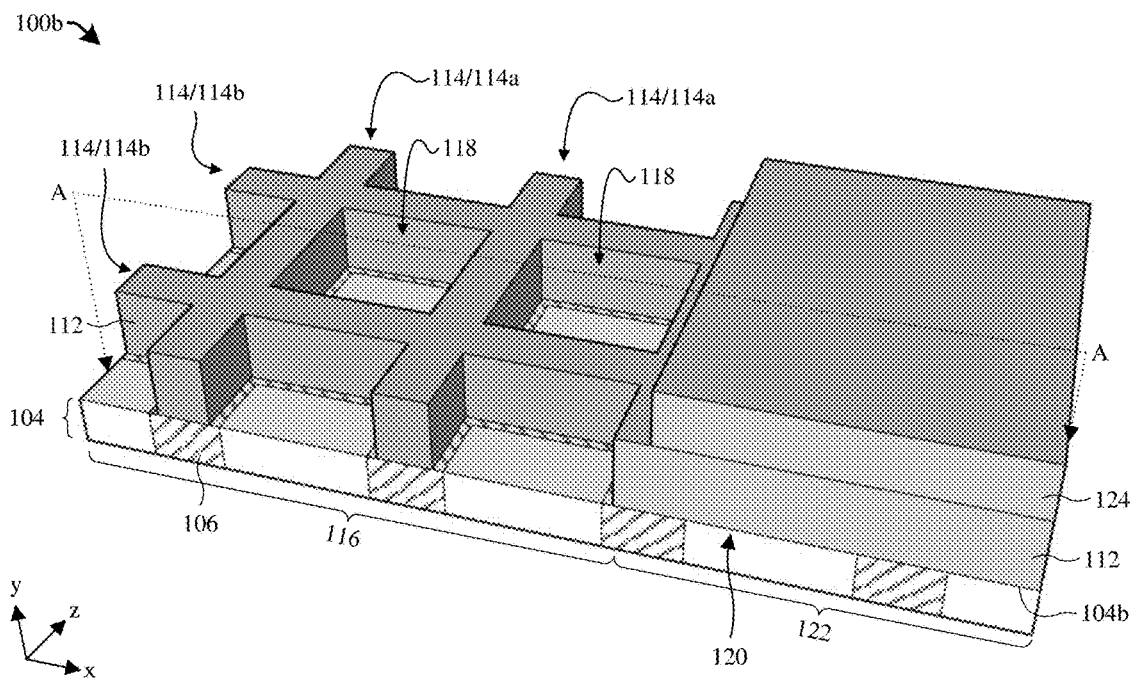

FIGS. 1A-1B illustrate various views 100a-100b of an image sensor having a metal grid structure 114 that improves the quantum efficiency of a plurality of photodetectors 102. FIG. 1A illustrates a cross-sectional view 100a of some embodiments of the image sensor. FIG. 1B illustrates a perspective view 100b of some embodiments of the image sensor illustrated in FIG. 1A. The cross-sectional view 100a of FIG. 1A is taken along line A-A of FIG. 1B.

As shown in the various views 100a-100b of FIGS. 1A-1B, an image sensor comprises a plurality of photodetectors 102 disposed in a semiconductor substrate 104. The plurality of photodetectors 102 are configured to absorb incident radiation (e.g., photons) and generate respective electrical signals corresponding to the incident radiation. In some embodiments, the plurality of photodetectors 102 are disposed in an array of photodetectors comprising a plurality of rows and columns. In further embodiments, the semiconductor substrate 104 comprises any type of semiconductor body (e.g., monocrystalline silicon/CMOS bulk, germanium (Ge), silicon-germanium (SiGe), a III-V semiconductor, silicon on insulator (SOI), etc.).

In some embodiments, an isolation structure 106 is disposed over/in the semiconductor substrate 104. The isolation structure 106 extends into the semiconductor substrate 104 and between the plurality of photodetectors 102. In some embodiments, the isolation structure 106 laterally surrounds each of the plurality of photodetectors 102. In further embodiments, the isolation structure 106 extends into the semiconductor substrate 104 from a back-side 104b of the semiconductor substrate 104. The back-side 104b of the semiconductor substrate 104 is opposite a front-side 104f of the semiconductor substrate 104.

A plurality of light filters 108 are disposed over the semiconductor substrate 104 and the photodetectors 102. The plurality of light filters 108 are disposed in a light filter array comprising a plurality of rows and columns. In some embodiments, each of the plurality of light filters 108 overlies and corresponds to a photodetector of the plurality of photodetectors 102. For example, a first light filter 108a overlies and corresponds to a first photodetector of the plurality of photodetectors 102, a second light filter 108b overlies and corresponds to a second photodetector of the plurality of photodetectors 102 different than the first photodetector, and a third light filter 108c overlies and corresponds to a third photodetector of the plurality of photodetectors 102 different than both the first and second photodetectors.

The plurality of light filters 108 are configured to transmit specific wavelengths (or specific ranges of wavelengths). For example, the first light filter 108a is configured to transmit light (e.g., photons having a wavelength between about 10 nm and about 1 mm) having wavelengths in a first range, the second light filter 108b is configured to transmit light having wavelengths in a second range different than the first range, and the third light filter 108c is configured to transmit light having wavelengths in a third range different than the first and second range. In some embodiments, the plurality of light filters 108 may be color filters. For example, the first light filter 108a may be a red color filter, the second light filter 108b may be a green color filter, and the third light filter 108c may be a blue color filter. In some embodiments, the plurality of light filters 108 may be infrared (IR) filters configured to filter incident radiation having an IR wavelength. In further embodiments, the plurality of light filters 108 may comprise a combination of color filters and/or IR filters.

A light filter grid structure 110 is disposed over the semiconductor substrate 104 and the photodetectors 102. The light filter grid structure 110 laterally surrounds the plurality of light filters 108. In other words, the light filter grid structure 110 comprises an array of openings that the plurality of light filters 108 are disposed within.

The plurality of light filters 108 are or comprise a light filtering material. In some embodiments, the light filtering material is or comprises, for example, a photoresist (e.g., a positive/negative photoresist) comprising a dye/pigment, a dispersant polymer, a polymerization monomer, and/or other chemicals (e.g., chemicals for the polymerization reaction). The light filter grid structure 110 is or comprises a dielectric material. For example, the light filter grid structure 110 may be or comprise, for example, an oxide (e.g., silicon dioxide ($SiO_2$)), a nitride (e.g., silicon nitride (SiN)), an oxy-nitride (e.g., silicon oxynitride ($SiO_XN_Y$)), or the like. In some embodiments, the light filtering material has a first refractive index, and the dielectric material of the light filter grid structure 110 has a second refractive index that is less than the first refractive index. In further embodiments, the dielectric material is a low refractive index (low-n) material (e.g., a material having a refractive index less than about 1.5).

A metal grid layer 112 is disposed over the semiconductor substrate 104 and the photodetectors 102. The metal grid layer 112 comprises a metal grid structure 114. The metal grid structure 114 overlies a central pixel region 116 of the semiconductor substrate 104. The metal grid structure 114 comprises a first plurality of elongated grid segments 114a and a second plurality of elongated grid segments 114b. The first plurality of elongated segments 114a are arranged in parallel with one another and extend laterally in a first direction (along the z-axis). The second plurality of elongated segments 114b are arranged in parallel with one another and extend laterally in a second direction (along the x-axis) that is orthogonal to the first direction.

The first plurality of elongated segments 114a intersect the second plurality of elongated segments 114b and define a plurality of grid openings 118 that extend vertically through the metal grid structure 114. The first plurality of elongated segments 114a and the second plurality of elongated segments 114b intersect one another at substantially right angles, such that the grid openings 118 are rectangular when viewed from above. As such, when compared to a typical metal grid structure (e.g., a metal grid structure having rounded corners when viewed from above), the metal grid structure 114 may reflect less incident radiation away from the photodetectors 102. Thus, the metal grid structure 114 may improve the quantum efficiency (QE) of the photodetectors 102, thereby increasing a performance of the image sensor.

In some embodiments, the metal grid layer 112 also comprises a peripheral metal structure 120. The peripheral metal structure 120 overlies a peripheral pixel region 122 of the semiconductor substrate 104. Unlike the metal grid structure 114, the peripheral metal structure 120 does not have grid openings. The metal grid structure 114 extends continuously over the central region 116 to the peripheral metal structure 120. In other words, the metal grid layer 112 is a continuous layer, and the metal grid structure 114 and the peripheral metal structure 120 are portions of the metal grid layer 112. In some embodiments, an upper surface of the metal grid structure 114 is substantially co-planar with an upper surface of the peripheral metal structure 120. In other embodiments, the upper surface of the metal grid structure 114 is disposed over or beneath the upper surface of the peripheral metal structure 120. The metal grid layer 112 is or comprises, for example, tungsten (W), aluminum (Al), titanium (Ti), tantalum (Ta), some other metal, or a combination of the foregoing.

An upper metal structure 124 is disposed over the peripheral metal structure 120. The upper metal structure 124 overlies the peripheral metal structure 120 and the peripheral pixel region 122. The upper metal structure 124 is laterally offset (along the x-axis) from the metal grid structure 114. In some embodiments, a lower surface of the upper metal structure 124 is disposed vertically over the upper surface of the metal grid structure 114. Like the peripheral metal structure 120, the upper metal structure 124 does not have grid openings. The upper metal structure 124 and the peripheral metal structure 120 are configured to block incident radiation from being transmitted to photodetectors 102 disposed in the peripheral pixel region 122 of the semiconductor substrate 102.

The upper metal structure 124 is or comprises, for example, tungsten (W), aluminum (Al), titanium (Ti), tantalum (Ta), some other metal, or a combination of the foregoing. In some embodiments, the upper metal structure 124 and the metal grid layer 112 are or comprise a same metal. For example, both the upper metal structure 124 and the metal grid layer 112 are tungsten (W). In other embodiments, the upper metal structure 124 may be or comprise a different metal that the metal grid layer 112.

A dielectric structure 126 is disposed over the upper metal structure 124 and the peripheral metal structure 120. The dielectric structure 126 overlies the peripheral pixel region 122. In some embodiments, a portion of the dielectric structure 126 is disposed laterally between (directly between) the plurality of light filters 108 and the upper metal structure 124. In further embodiments, the portion of the dielectric structure 126 is also disposed laterally between (directly between) the plurality of light filters 108 and the peripheral metal structure 120.

In some embodiments, an upper surface of the dielectric structure 126 is substantially co-planar with an upper surface of the light filter grid structure 110. In other embodiments, the upper surface of the dielectric structure 126 is disposed below or above the upper surface of the light filter grid structure 110. In some embodiments, the dielectric structure 126 may be or comprise, for example, an oxide (e.g., $SiO_2$), a nitride (e.g., SiN), an oxy-nitride (e.g., $SiO_XN_Y$), or the like. In further embodiments, the dielectric structure 126 may be or comprise a same material as the light filter grid structure 110. In other embodiments, the dielectric structure 126 may be or comprise a different dielectric material than the light filter grid structure 110.

Figure 2:
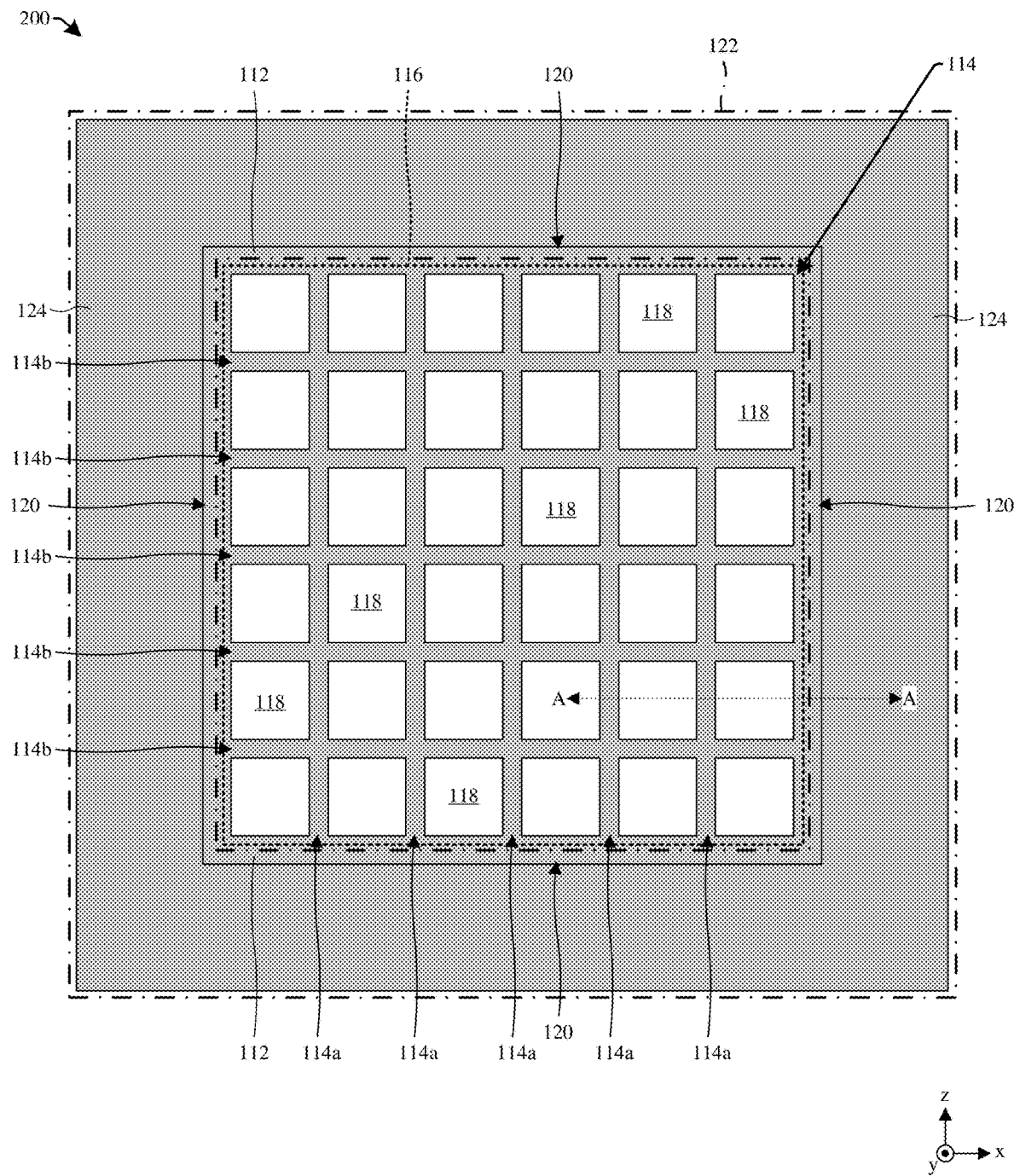
FIG. 2 illustrates a top-view of some embodiments of the metal grid layer and the upper metal structure of the image sensor of FIGS. 1A-1B.

FIG. 2 illustrates a top-view 200 of some embodiments of the metal grid layer 112 and the upper metal structure 124 of the image sensor of FIGS. 1A-1B. For clarity in FIG. 2, the top-view 200 of FIG. 2 does not illustrate several features illustrated in FIGS. 1A-1B (e.g., the semiconductor substrate 104, the photodetectors 102, etc.), but rather only illustrates the metal grid layer 112 and the upper metal structure 124 for clarity in FIG. 2. In some embodiments, the cross-sectional view 100a of FIG. 1A is taken along line A-A of FIG. 2.

As shown in the top-view 200 of FIG. 2, the metal grid layer 112 comprises the metal grid structure 114 and the peripheral metal structure 120. The metal grid structure 114 overlies the central pixel region 116 of a semiconductor substrate 104. The peripheral metal structure 120 overlies the peripheral pixel region 122 of the semiconductor substrate 104.

As shown in the top-view 200 of FIG. 2, in some embodiments, the peripheral pixel region 122 laterally encloses the central pixel region 116. The peripheral metal structure 120 extends laterally in a closed loop path, such that the peripheral metal structure 120 laterally encloses the metal grid structure 114. In some embodiments, the peripheral metal structure 120 has a ring-like layout (e.g., a square ring-like layout). In such embodiments, the peripheral metal structure 120 may be referred to as a ring-like peripheral metal structure.

The upper metal structure 124 is disposed over the metal grid layer 112 and overlies both the peripheral metal structure 120 and the peripheral pixel region 122. In some embodiments, the upper metal structure 124 is laterally offset (along both the z-axis and the x-axis) from the metal grid structure 114. The upper metal structure 124 extends laterally in a closed loop path, such that the upper metal structure 124 laterally encloses the metal grid structure 114. In some embodiments, the upper metal structure 124 has a ring-like layout (e.g., a square ring-like layout). In such embodiments, the upper metal structure 124 may be referred to as a ring-like upper metal structure.

The metal grid structure 114 is configured to reduce cross-talk and increase sensitivity (e.g., quantum efficiency (QE)) between adjacent photodetectors 102 disposed in the central pixel region 116 of the semiconductor substrate 104. The upper metal structure 124 and the peripheral metal structure 120 are configured to block (e.g., completely block) incident radiation from being transmitted to photodetectors 102 disposed in the peripheral pixel region 122 of the semiconductor substrate 102. In some embodiments, the upper metal structure 124 and the peripheral metal structure 120 ensure the incident radiation is adequately blocked from the photodetectors 102 disposed in the peripheral pixel region 122 of the semiconductor substrate 102 (e.g., due to a combined thickness of the upper metal structure 124 and the peripheral metal structure 120 being greater than threshold thickness). In other words, if only one of the upper metal structure 124 or the peripheral metal structure 120 was disposed over the peripheral pixel region 122, some incident radiation would undesirably pass through the upper metal structure 124 (or the peripheral metal structure 120) and be adsorbed by the photodetectors 102 disposed in the peripheral pixel region 122 of the semiconductor substrate 102. For example, in some embodiments, the photodetectors 102 disposed in the peripheral pixel region 122 of the semiconductor substrate 102 are configured to provide a reference signal for black level correction (BLC) of the image sensor. As such, if incident radiation passed through the upper metal structure 124 (or the peripheral metal structure 120) (e.g., due to only one of the upper metal structure 124 or the peripheral metal structure 120 being disposed over the peripheral pixel region 122), the BLC of the image sensor may suffer, thereby reducing a performance of the image sensor.

Figure 3:
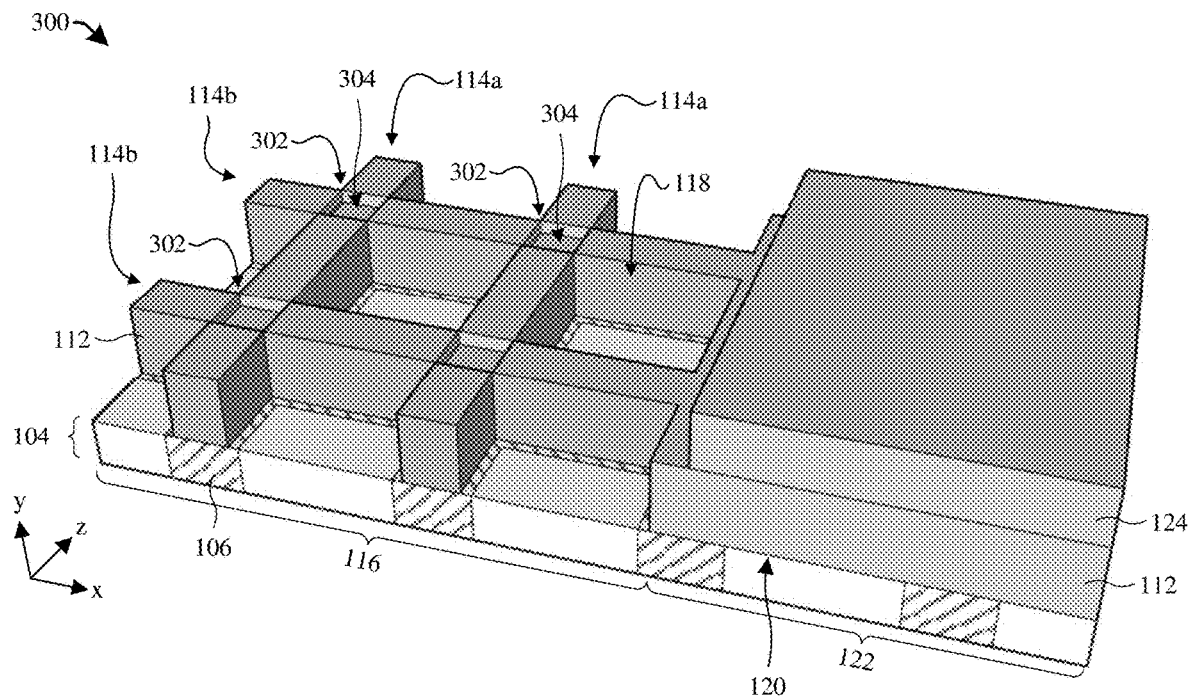
FIG. 3 illustrates a perspective view of some other embodiments of the image sensor illustrated in FIGS. 1A-1B.

FIG. 3 illustrates a perspective view 300 of some other embodiments of the image sensor illustrated in FIGS. 1A-1B.

As shown in the perspective view 300 of FIG. 3, the metal grid structure 114 comprises the first plurality of elongated grid segments 114a and the second plurality of elongated grid segments 114b. The first plurality of elongated segments 114a and the second plurality of elongated segments 114b intersect one another at intersection points 302. In some embodiments, the intersection points 302 have square-like footprints, respectively.

The intersection points 302 have upper surfaces 304, respectively. In some embodiments, the upper surfaces of the intersection points 302 are upper surfaces of the metal grid layer 112, respectively. In some embodiments, the upper surfaces 304 of the intersection points 302 are vertically offset (along the y-axis) from upper surfaces of the first plurality of elongated segments 114a and upper surfaces of the second plurality of elongated segments 114b. For example, as shown in the perspective view 300 of FIG. 3, the upper surfaces 304 of the intersection points 302 are disposed below the upper surfaces of the first plurality of elongated segments 114a and the upper surfaces of the second plurality of elongated segments 114b. In some embodiments, the upper surfaces 304 of the intersection points 302 are substantially planar (e.g., flat). In other embodiments, the upper surfaces 304 of the intersection points 302 are concave. In further embodiments, the upper surfaces of the first plurality of elongated segments 114a are substantially co-planar with the upper surfaces of the second plurality of elongated segments 114b.

Figure 4:
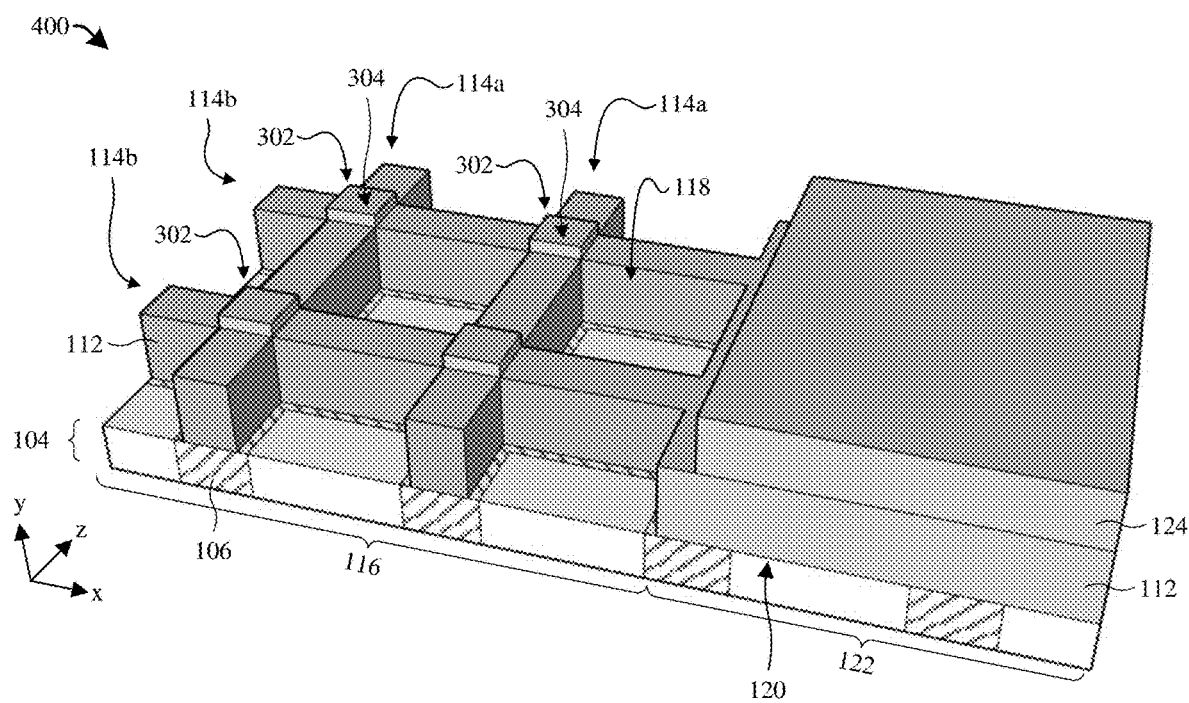
FIG. 4 illustrates a perspective view of some other embodiments of the image sensor illustrated in FIGS. 1A-1B.

FIG. 4 illustrates a perspective view 400 of some other embodiments of the image sensor illustrated in FIGS. 1A-1B.

As shown in the perspective view 400 of FIG. 4, the upper surfaces 304 of the intersection points 302 are vertically offset (along the y-axis) from the upper surfaces of the first plurality of elongated segments 114a and the upper surfaces of the second plurality of elongated segments 114b. For example, as shown in the perspective view 400 of FIG. 4, the upper surfaces 304 of the intersection points 302 are disposed over the upper surfaces of the first plurality of elongated segments 114a and the upper surfaces of the second plurality of elongated segments 114b.

Figure 5:
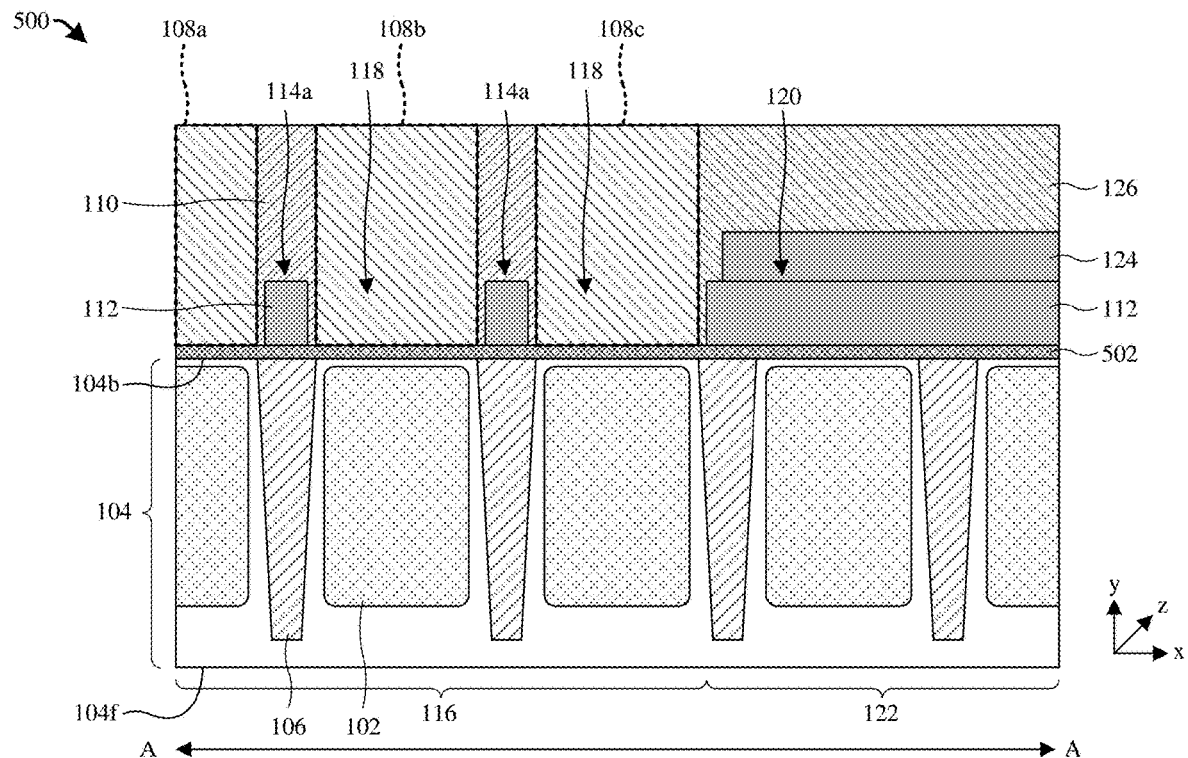
FIG. 5 illustrates a cross-sectional view of some other embodiments of the image sensor illustrated in FIGS. 1A-1B.

FIG. 5 illustrates a cross-sectional view 500 of some other embodiments of the image sensor illustrated in FIGS. 1A-1B.

As shown in the cross-sectional view 500 of FIG. 5, a dielectric layer 502 is disposed over the semiconductor substrate 104. The dielectric layer 502 is disposed vertically between the metal grid layer 112 and the semiconductor substrate 104, vertically between the light filter grid structure 110 and the semiconductor substrate 104, vertically between the upper metal structure 124 and the semiconductor substrate 104, and vertically between the dielectric structure 126 and the semiconductor substrate 104. In some embodiments, the dielectric layer 502 is disposed vertically between the plurality of light filters 108 and the semiconductor substrate 104, as shown in the cross-sectional view 500 of FIG. 5. The dielectric layer 502 extends continuously across both the central pixel region 116 and the peripheral pixel region 122 of the semiconductor substrate 104. In some embodiments, the dielectric layer 502 may have a same layout (e.g., a same footprint) as the light filter grid structure 110 and the dielectric structure 126.

The dielectric layer 502 may be or comprise, for example, an oxide (e.g., $SiO_2$), a nitride (e.g., SiN), an oxy-nitride (e.g., $SiO_XN_Y$), or the like. In some embodiments, the dielectric layer 502 is silicon dioxide ($SiO_2$). In some embodiments, a thickness of the dielectric layer 502 is between about 200 angstroms (Å) and about 5000 Å.

Figure 6:
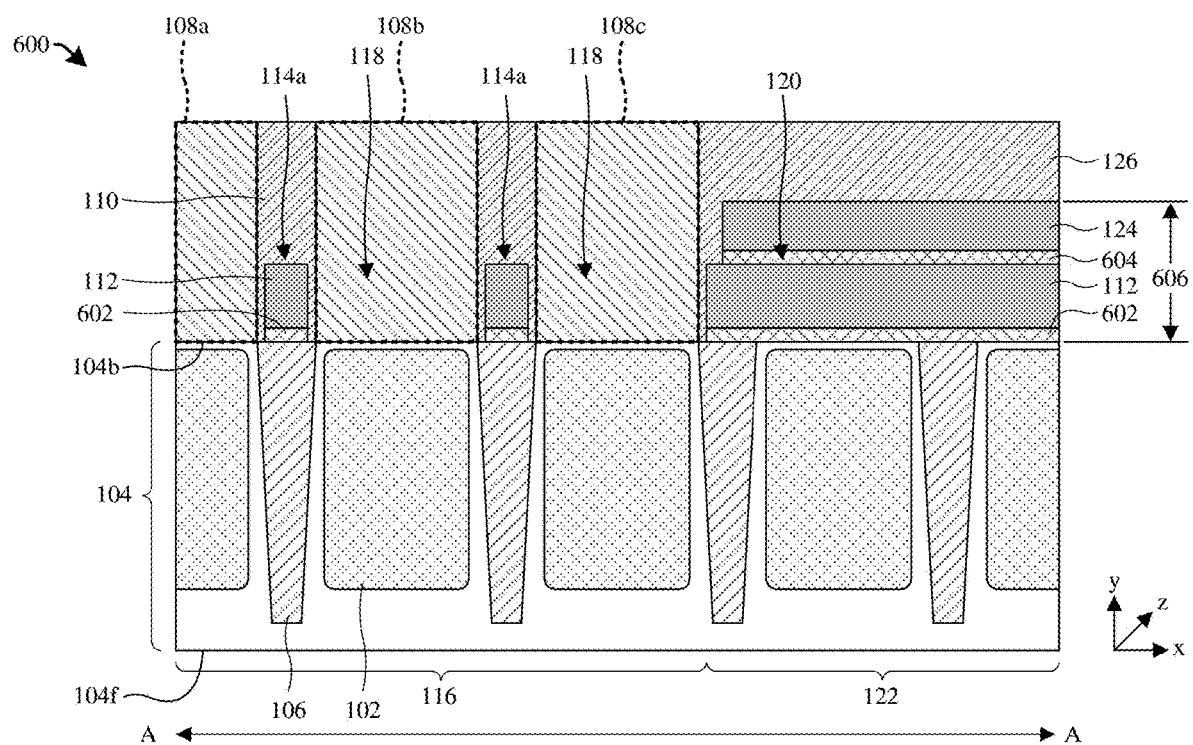
FIG. 6 illustrates a cross-sectional of some other embodiments of the image sensor illustrated in FIGS. 1A-1B.

FIG. 6 illustrates a cross-sectional 600 of some other embodiments of the image sensor illustrated in FIGS. 1A-1B.

As shown in the cross-sectional view 600 of FIG. 6, a first etch stop structure 602 is disposed over the semiconductor substrate 104. The first etch stop structure 602 is disposed vertically between the metal grid layer 112 and the semiconductor substrate 104. The first etch stop structure 602 has a same layout (e.g., footprint) as the metal grid layer 112. In some embodiments, the first etch stop structure 602 is or comprises, an oxide (e.g., $SiO_2$), a nitride (e.g., SiN), an oxy-nitride (e.g., $SiO_XN_Y$), a metal nitride (e.g., tantalum nitride (TaN), titanium nitride (TiN), etc.), some other etch stop material, or a combination of the foregoing. In some embodiments, the first etch stop structure 602 has a thickness between about 200 Å and about 1000 Å.

A second etch stop structure 604 may also be disposed over the semiconductor substrate 104. The second etch stop structure 604 is disposed vertically between the peripheral metal structure 120 and the upper metal structure 124. In some embodiments, the second etch stop structure 604 has a same layout (e.g., footprint) as the upper metal structure 124.

In some embodiments, the second etch stop structure 604 is or comprises, an oxide (e.g., $SiO_2$), a nitride (e.g., SiN), an oxy-nitride (e.g., $SiO_XN_Y$), a metal nitride (e.g., tantalum nitride (TaN), titanium nitride (TiN), etc.), some other etch stop material, or a combination of the foregoing. In further embodiments, the first etch stop structure 602 and the second etch stop structure 604 are a same material. For example, the first etch stop structure 602 and the second etch stop structure 604 are both titanium nitride (TiN). In some embodiments, the second etch stop structure 604 has a thickness between about 200 Å and about 1000 Å.

The metal grid layer 112 has a thickness between about 200 Å and about 5000 Å. The upper metal structure 124 has a thickness between about 200 Å and about 5000 Å. A combined thickness 606 of the first etch stop structure 602, the peripheral metal structure 120, the second etch stop structure 604, and the upper metal structure 124 is at least about 2000 Å. More specifically, the thickness 606 is between about 2000 Å and about 5000 Å. If the thickness 606 is less than about 2000 Å, incident radiation may not be adequately blocked from the photodetectors 102 disposed in the peripheral pixel region 122 of the semiconductor substrate 102 due to the thickness 606 (e.g., due to a small thickness allowing incident radiation to pass through the first etch stop structure 602, the peripheral metal structure 120, the second etch stop structure 604, and the upper metal structure 124 to the photodetectors 102 disposed in the peripheral pixel region 122). As such, if the thickness 606 is less than about 2000 Å, the BLC of the image sensor may suffer, thereby reducing a performance of the image sensor.

Figure 7:
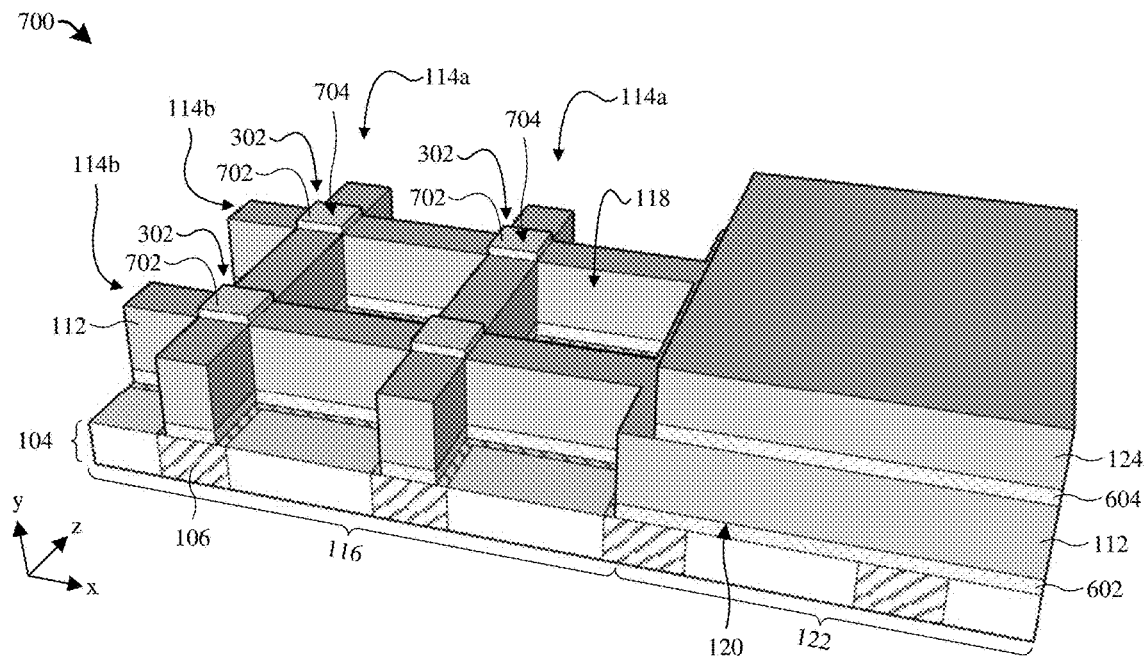
FIG. 7 illustrates a perspective view of some embodiments of the image sensor illustrated in FIG. 6.

FIG. 7 illustrates a perspective view 700 of some embodiments of the image sensor illustrated in FIG. 6.

As shown in the perspective view 700 of FIG. 7, the metal grid structure 114 comprises the first plurality of elongated grid segments 114a and the second plurality of elongated grid segments 114b. The first plurality of elongated segments 114a and the second plurality of elongated segments 114b intersect one another at intersection points 302. In some embodiments, the intersection points 302 have square-like footprints, respectively.

Etch stop remnant structures 702 are disposed over (e.g., directly over) the intersection points 302. The etch stop remnant structures 702 are portions of a second etch stop layer that remain after an etching process that forms the second etch stop structure 604, which is described in more detail hereinafter. As shown in in the perspective view 700 of FIG. 7, the etch stop remnant structures 702 may have a same footprint as the intersection points 302. In other embodiments, the etch stop remnant structures 702 may have a different footprint than the intersection points 302. For example, the etch stop remnant structures 702 may only cover a portion of the upper surfaces of the intersection points 302.

In some embodiments, a thickness of the etch stop remnant structures 702 is less than a thickness of the portion of the second etch stop structure 604 that overlies the peripheral pixel region 122. In further embodiments, upper surfaces 704 of the etch stop remnant structures 702 are substantially planar (e.g., flat). In other embodiments, the upper surfaces 704 of the etch stop remnant structures 702 are concave.

Figure 8:
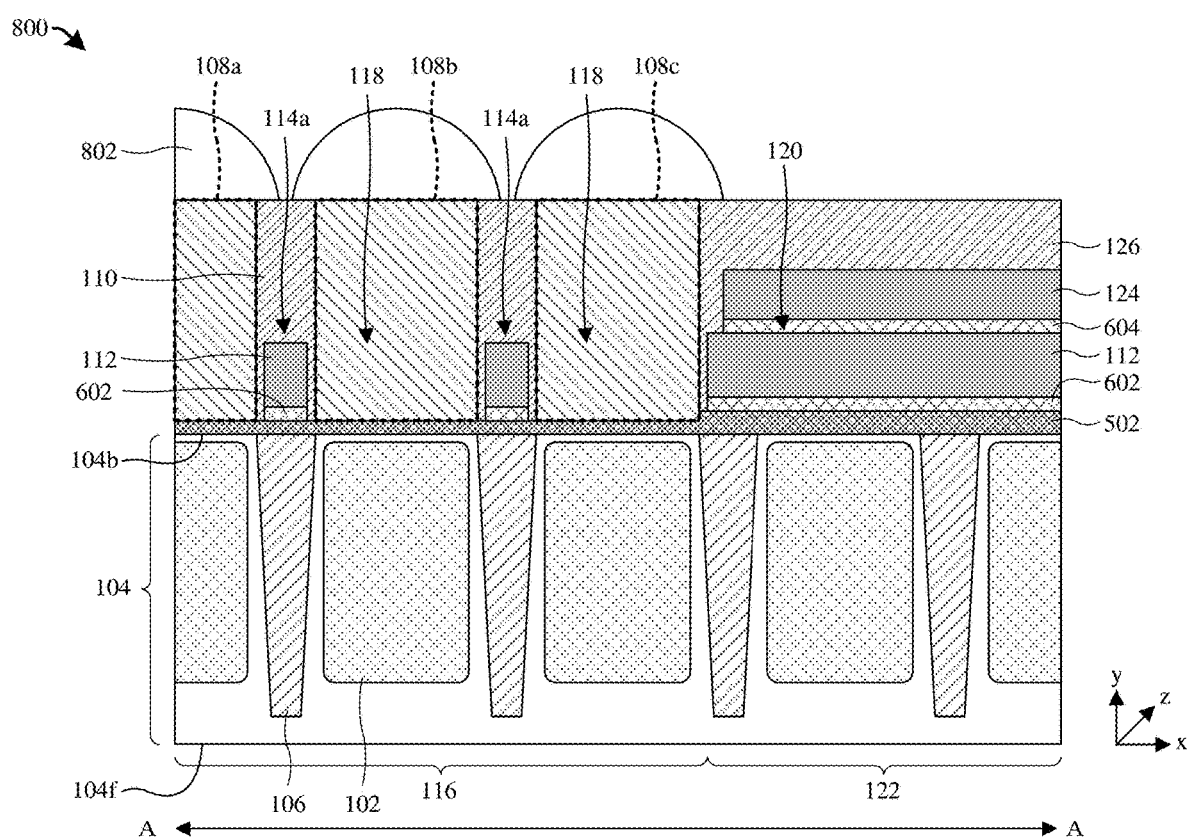
FIG. 8 illustrates a cross-sectional of some other embodiments of the image sensor illustrated in FIGS. 1A-1B.

FIG. 8 illustrates a cross-sectional 800 of some other embodiments of the image sensor illustrated in FIGS. 1A-1B.

As shown in the cross-sectional view 800 of FIG. 8, a plurality of micro-lens 802 are disposed over the semiconductor substrate 104 and the plurality of light filters 108. The plurality of micro-lens 802 overlie the plurality of light filters 108, respectively. Each of the plurality of micro-lens 802 are configured to focus incident radiation toward an underlying photodetector of the plurality of photodetectors 102. In some embodiments, the plurality of micro-lens 802 overlie (e.g., only overlie) the central pixel region 116 of the semiconductor substrate 104. In other embodiments, the plurality of micro-lens 802 overlie both the central pixel region 116 and the peripheral pixel region 122 of the semiconductor substrate 104. In such embodiments, some of the plurality of micro-lens 802 overlie the plurality of light filters 108 and some other of the plurality of micro-lens 802 overlie the dielectric structure 126.

In some embodiments, the dielectric layer 502 is disposed vertically between the first etch stop structure 602 and the semiconductor substrate 104. In some embodiments, the dielectric layer 502 has a first thickness in the central pixel region 116 and a second thickness that is greater than the first thickness in the peripheral pixel region 122, as shown in the cross-sectional view 800 of FIG. 8.

Figure 9A:
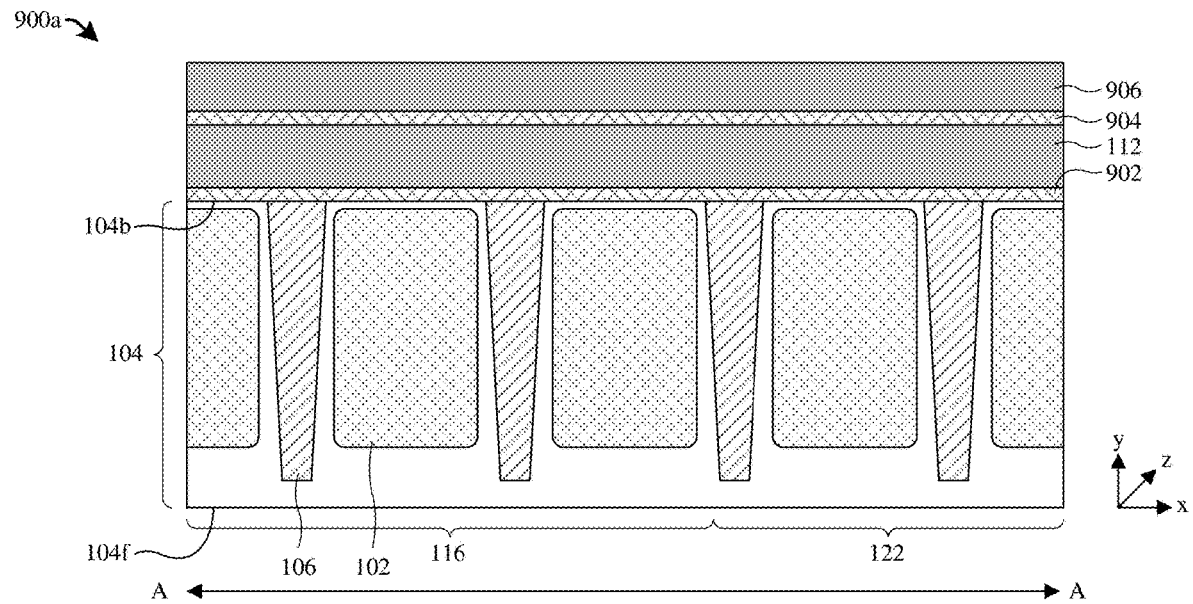
FIGS. 9A-9B through FIG. 20 illustrate a series of various views of some embodiments of a method for forming an image sensor having a metal grid structure that improves the QE of a plurality of photodetectors.
Figure 9B:
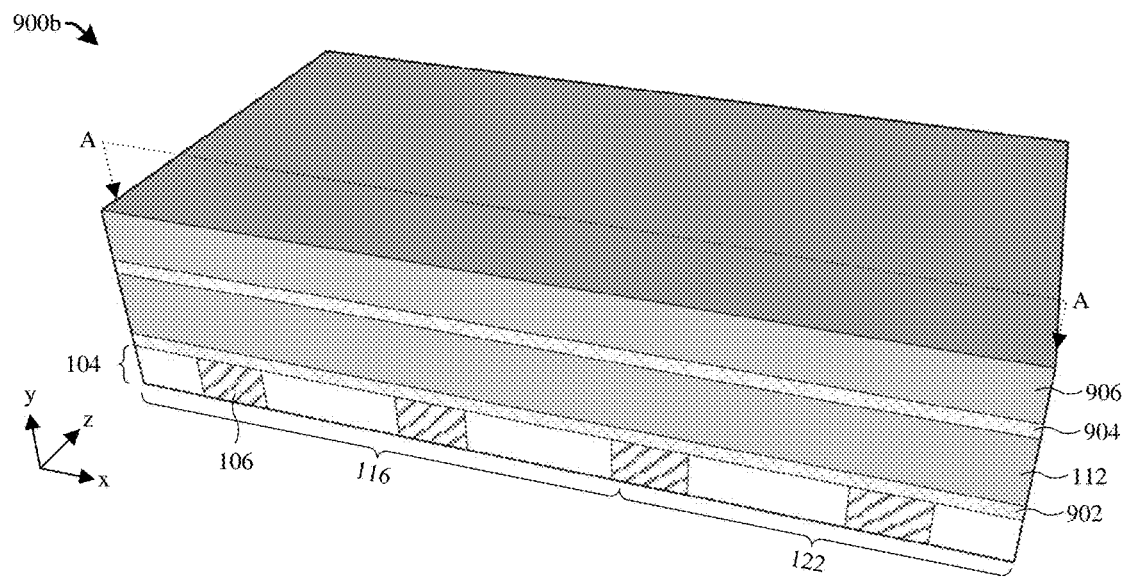
Figure 19:
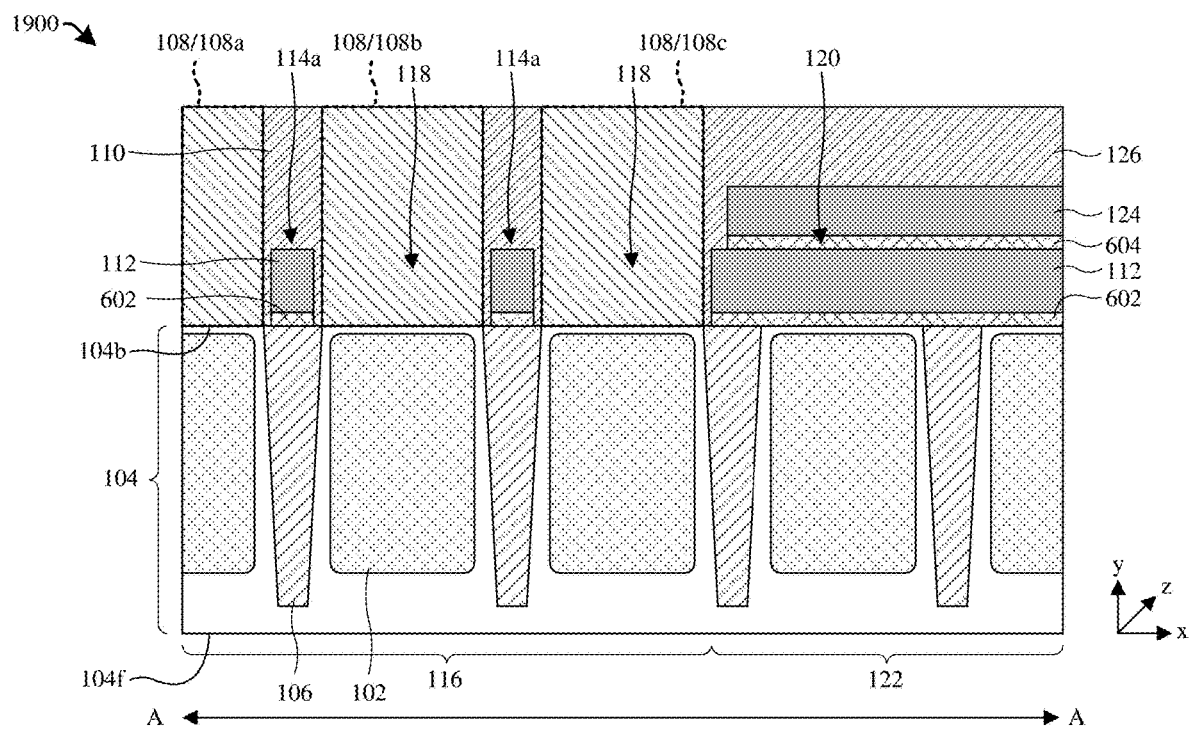
Figure 20:
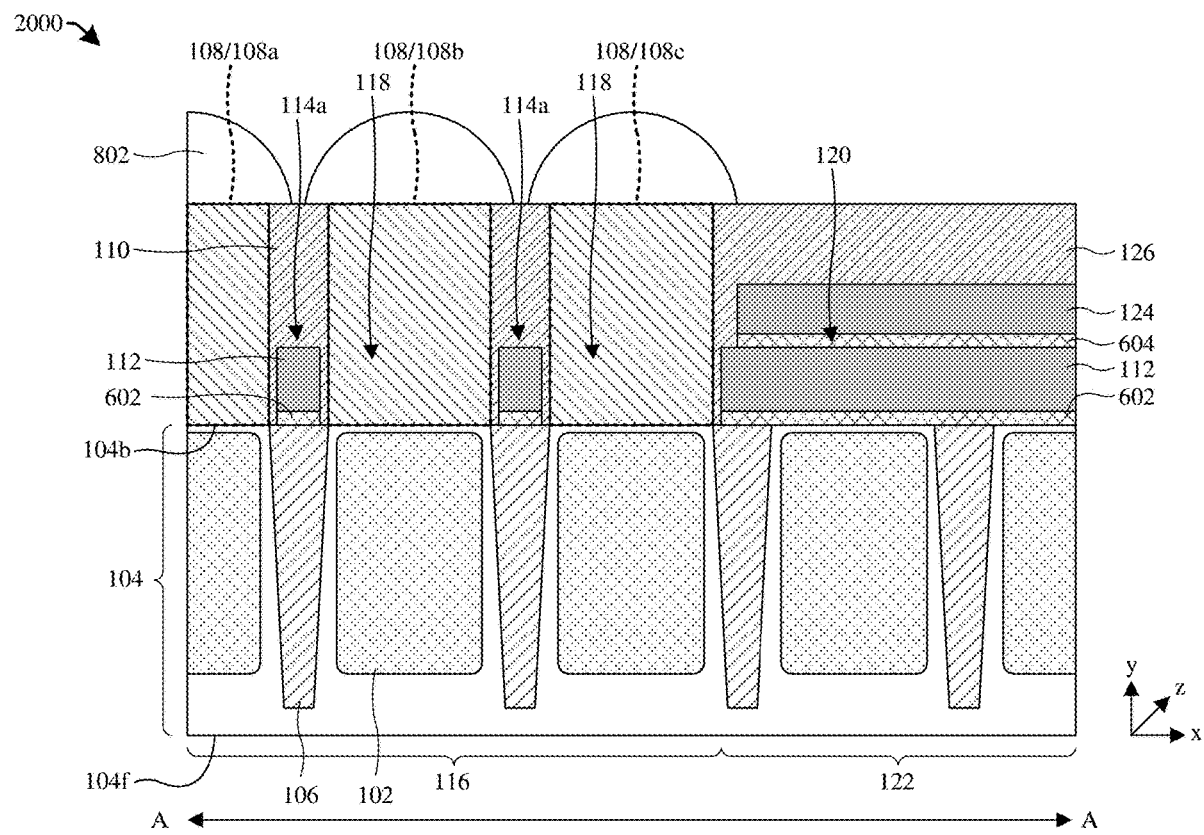

FIGS. 9A-9B through FIG. 20 illustrate a series of various views of some embodiments of a method for forming an image sensor having a metal grid structure 114 that improves the QE of a plurality of photodetectors 102. Figures with a suffix of "A" (e.g., FIG. 9A-17A) illustrate a series of cross-sectional views 900a-1700a of some embodiments for forming the image sensor having a metal grid structure 114 that improves a performance of the image sensor. Figures with a suffix of "B" (e.g., FIG. 9B-17B) illustrate a series of perspective views 900b-1700b of corresponding figures of FIGS. 9A-17A (e.g., FIG. 9B illustrates a perspective view 900b of the structure of FIG. 9A). The cross-sectional views 900a-1700a are taken along line A-A of their corresponding perspective views (e.g., the cross-sectional view 900a of FIG. 9A is taken along line A-A of the perspective view 900b of FIG. 9b). Figures without a suffix (e.g., FIGS. 18-20) illustrate a series of cross-sectional views 1800-2000 that continue the series of various views from the cross-sectional view 1700a of FIG. 17A. The cross-sectional views 1800-2000 are taken along the same line A-A as the cross-sectional view 1700a of FIG. 17A. Although FIGS. 9A-9B through 20 are described with reference to a method, it will be appreciated that the structures shown in FIGS. 9A-9B through 20 are not limited to the method but rather may stand alone separate of the method.

As shown in cross-sectional view 900a of FIG. 9A and perspective view 900b of FIG. 9B, a first etch stop layer 902 is formed over a semiconductor substrate 104. A plurality of photodetectors 102 are disposed in the semiconductor substrate 104. In some embodiments, an isolation structure 106 is disposed within the semiconductor substrate 104 and laterally surrounding the plurality of photodetectors 102. While not explicitly shown in the cross-sectional view 900a of FIG. 9A and the perspective view 900b of FIG. 9B, it will be appreciated that the plurality of photodetectors 102 and the isolation structure 106 may be formed in the semiconductor substrate 104 before the first etch stop layer 902 by known complementary metal-oxide-semiconductor (CMOS) processes.

In some embodiments, a process for forming the first etch stop layer 902 comprises depositing the first etch stop layer 902 on the semiconductor substrate 104 and the isolation structure 106. The first etch stop layer 902 may be deposited by, for example, chemical vapor deposition (CVD), physical vapor deposition (PVD), atomic layer deposition (ALD), some other deposition process, or a combination of the foregoing. The first etch stop layer 902 may be or comprise, an oxide (e.g., $SiO_2$), a nitride (e.g., SiN), an oxy-nitride (e.g., $SiO_XN_Y$), a metal nitride (e.g., tantalum nitride (TaN), titanium nitride (TiN), etc.), some other etch stop material, or a combination of the foregoing. In some embodiments, the first etch stop layer 902 is deposited with a thickness between about 200 Å and about 1000 Å. In some embodiments, a dielectric layer (see, e.g., dielectric layer 502) may be formed (e.g., via CVD, PVD, ALD, thermal oxidation, etc.) over the semiconductor substrate 104 and the isolation structure 106 before the first etch stop layer 902. In such embodiments, the first etch stop layer 902 is formed over the dielectric layer (e.g., deposited on the dielectric layer 502).

Also shown in the cross-sectional view 900a of FIG. 9A and the perspective view 900b of FIG. 9B, a metal grid layer 112 is formed over the first etch stop layer 902, a second etch stop layer 904 is formed over the metal grid layer 112, and an upper metal layer 906 is formed over the second etch stop layer 904. In some embodiments, the first etch stop layer 902 and/or the second etch stop layer 904 are omitted, and thus not formed. In some embodiments, a process for forming the metal grid layer 112 comprises depositing the metal grid layer 112 on the first etch stop layer 902. The metal grid layer 112 may be deposited by, for example, CVD, PVD, ALD, sputtering, electrochemical plating, electroless plating, some other deposition process, or a combination of the foregoing. In some embodiments, the metal grid layer 112 is deposited with a thickness between about 200 Å and about 5000 Å.

In some embodiments, a process for forming the second etch stop layer 904 comprises depositing or growing the second etch stop layer 904 on the metal grid layer 112. The second etch stop layer 904 may be deposited or grown by, for example, CVD, PVD, ALD, thermal oxidation, some other deposition process, or a combination of the foregoing. The second etch stop structure 604 may be or comprise, an oxide (e.g., $SiO_2$), a nitride (e.g., SiN), an oxy-nitride (e.g., $SiO_XN_Y$), a metal nitride (e.g., tantalum nitride (TaN), titanium nitride (TiN), etc.), some other etch stop material, or a combination of the foregoing. In some embodiments, the first etch stop layer 902 and the second etch stop layer 904 are a same material. For example, the first etch stop layer 902 and the second etch stop layer 904 are both titanium nitride (TiN). In some embodiments, the second etch stop layer 904 is deposited with a thickness between about 200 Å and about 1000 Å.

In some embodiments, a process for forming the upper metal layer 906 comprises depositing the upper metal layer 906 on the second etch stop layer 904. The upper metal layer 906 may be deposited by, for example, CVD, PVD, ALD, sputtering, electrochemical plating, electroless plating, some other deposition process, or a combination of the foregoing. The upper metal layer 906 may be or comprise, for example, tungsten (W), aluminum (Al), titanium (Ti), tantalum (Ta), some other metal, or a combination of the foregoing. In some embodiments, the upper metal layer 906 and the metal grid layer 112 are or comprise a same metal. For example, both the upper metal layer 906 and the metal grid layer 112 are tungsten (W). In other embodiments, the upper metal layer 906 may be or comprise a different metal that the metal grid layer 112. In some embodiments, the upper metal layer 906 is deposited with a thickness between about 200 Å and about 5000 Å.

Figure 10A:
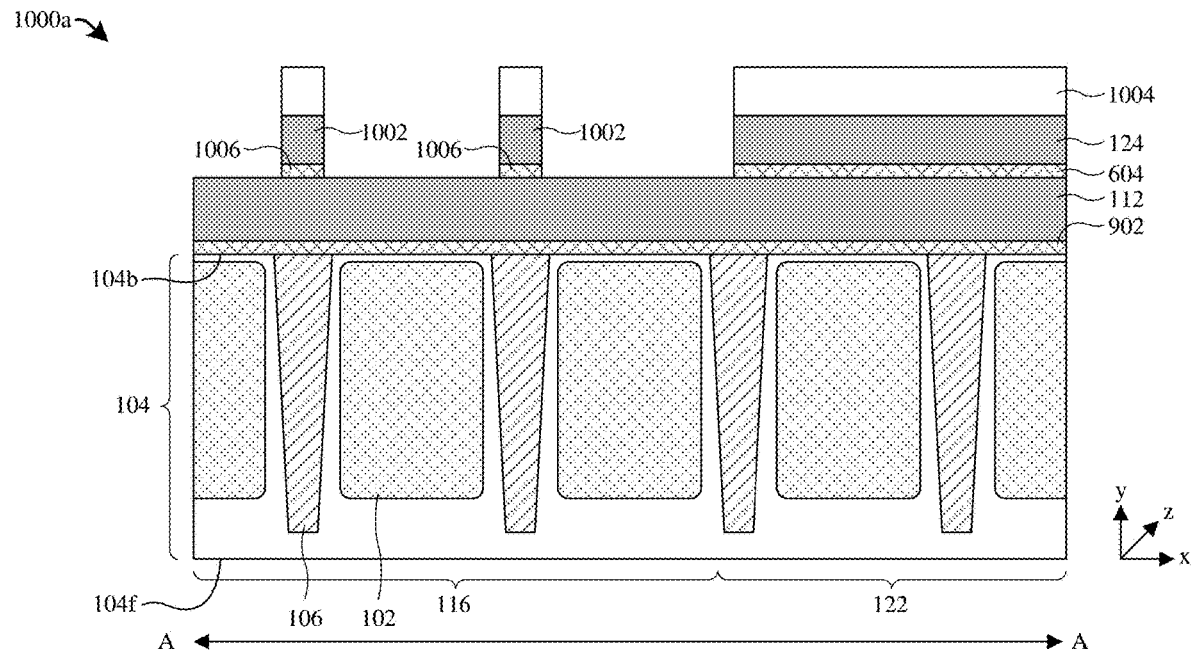
Figure 10B:
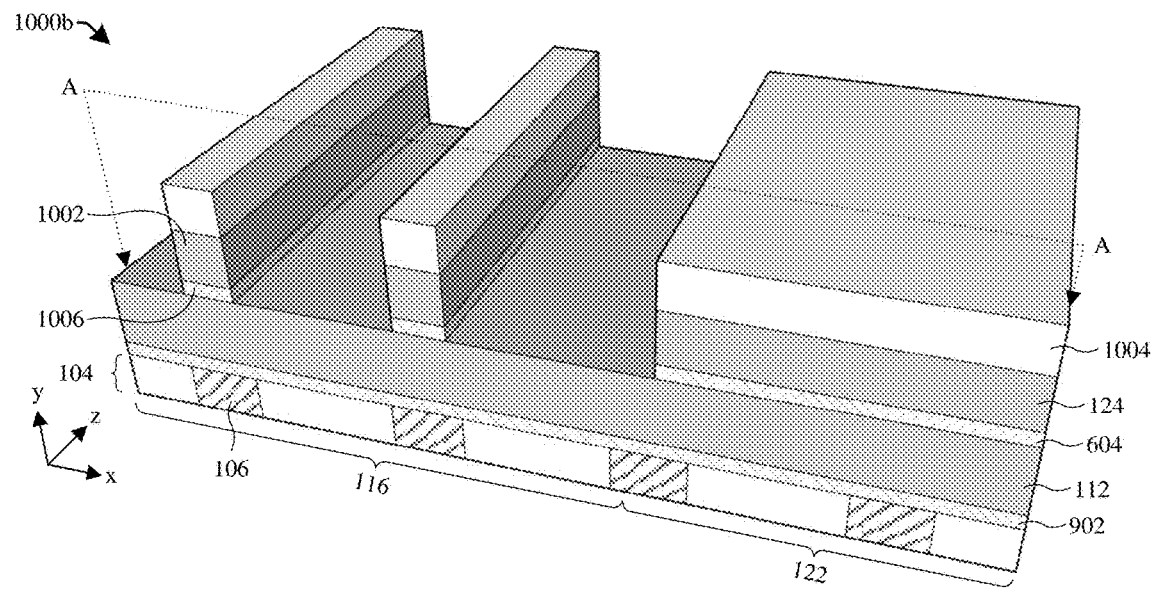

As shown in cross-sectional view 1000a of FIG. 10A and perspective view 1000b of FIG. 10B, a plurality of elongated metal segments 1002 and an upper metal structure 124 are formed over the metal grid layer 112. The plurality of elongated metal segments 1002 and the upper metal structure 124 are formed via a first patterning process. The first patterning process comprises forming a patterned masking layer 1004 (e.g., positive/negative photoresist, a hardmask, etc.) over the upper metal layer 906 (see, FIGS. 9A-9B). The patterned masking layer 1004 may be formed by forming a masking layer (not shown) on the upper metal layer 906 (e.g., via a spin-on process), exposing the masking layer to a pattern (e.g., via a lithography process, such as photolithography, extreme ultraviolet lithography, or the like), and developing the masking layer, thereby forming the patterned masking layer 1004 over the upper metal layer 906.

Thereafter, with the patterned masking layer 1004 in place over the upper metal layer 906, a first etching process (e.g., anisotropic etching process) is performed on the upper metal layer 906 to selectively etch the upper metal layer 906 according to the patterned masking layer 1004. The first etching process removes unmasked portions of the upper metal layer 906, thereby forming the plurality of elongated metal segments 1002 and the upper metal structure 124. In some embodiments, the first etching process may be, for example, a dry etching process, a reactive ion etching (RIE) process, a wet etching process, some other etching process, or a combination of the foregoing. In further embodiments, the first etching process is a dry etching process (or a RIE process) that has a chlorine-based etch chemistry (e.g., chlorine gas ($Cl_2$)/argon (Ar), or the like).

The plurality of elongated metal segments 1002 extend continuously over the central region 116 to the upper metal structure 124. In other words, the plurality of elongated metal segments 1002 and the upper metal structure 124 are portions of a continuous metal layer. In some embodiments, the upper metal structure 124 has a ring-like layout (e.g., a square ring-like layout). In such embodiments, the upper metal structure 124 may be referred to as a ring-like upper metal structure. The plurality of elongated metal segments 1002 extend continuously between opposites inner sidewalls of the ring-like upper metal structure.

Also shown in the cross-sectional view 1000a of FIG. 10A and the perspective view 1000b of FIG. 10B, a second etch stop structure 604 and a plurality of elongated etch stop segments 1006 are formed over the metal grid layer 112. The second etch stop structure 604 has substantially the same layout (e.g., footprint) as the upper metal structure 124. The plurality of elongated etch stop segments 1006 have substantially the same layouts (e.g., footprints) as the plurality of elongated metal segments 1002, respectively.

In some embodiments, a process for forming the second etch stop structure 604 and the plurality of elongated etch stop segments 1006 comprises performing a second etching process (e.g., anisotropic etching process) on the second etch stop layer 904 (see, FIGS. 9A-9B). The second etching process is performed on the second etch stop layer 904 with the patterned masking layer 1004 in place over the plurality of elongated metal segments 1002, the upper metal structure 124, and the second etch stop layer 904, thereby selectively etching the second etch stop layer 904 according to the masking layer 1004. The second etching process removes unmasked portions of the second etch stop layer 904, thereby forming the second etch stop structure 604 and the plurality of elongated etch stop segments 1006. In some embodiments, the second etching process may be, for example, a dry etching process, a RIE process, a wet etching process, some other etching process, or a combination of the foregoing. In further embodiments, the second etching process is a dry etching process (or a RIE process) that has a fluorine-based etch chemistry (e.g., carbon tetrafluoride ($CF_4$), trifluoromethane ($CHF_3$), octafluorocyclobutane ($C_4F_8$), or the like).

In some embodiments, the patterned masking layer 1004 is stripped away after the second etching process. In other embodiments, the patterned masking layer 1004 is stripped away after the first etching process but before the second etching process. In such embodiments, the plurality of elongated metal segments 1002 and the upper metal structure 124 may be utilized as a masking layer during the second etching process, thereby selectively etching the second etch stop layer 904 according to the plurality of elongated metal segments 1002 and the upper metal structure 124 (and thus forming the second etch stop structure 604 and the plurality of elongated etch stop segments 1006).

Figure 11A:
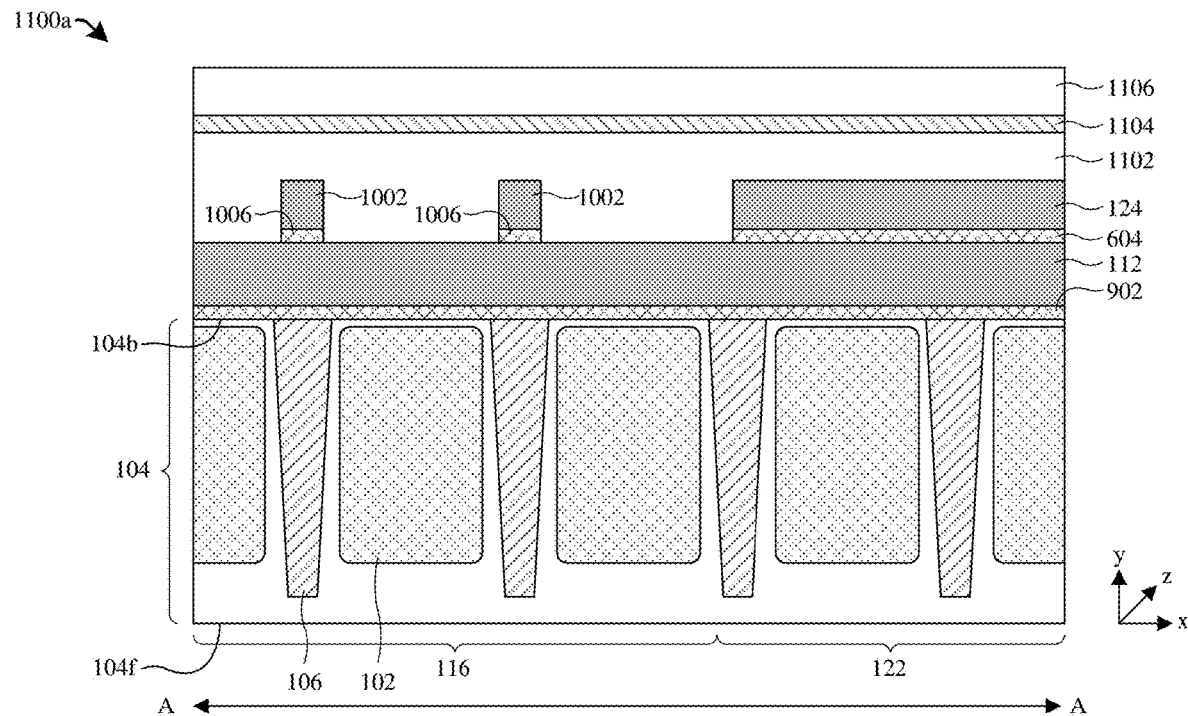
Figure 11B:
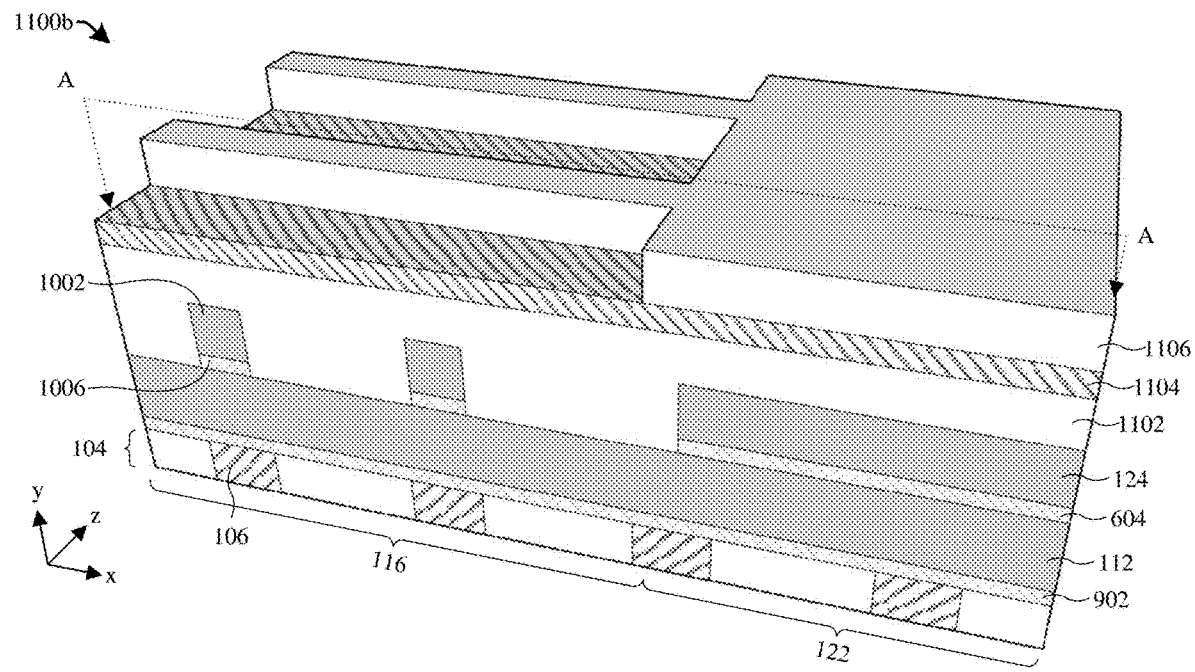

As shown in cross-sectional view 1100a of FIG. 11A and perspective view 1100b of FIG. 11B, a first masking layer 1102 is formed over the metal grid layer 112, the upper metal structure 124, and the plurality of elongated metal segments 1002. A second masking layer 1104 is then formed over the first masking layer 1102. Thereafter, a patterned masking layer 1106 is formed over the second masking layer 1104. In some embodiments, the first masking layer 1102, the second masking layer 1104, and the patterned masking layer 1106 are referred to collectively as a tri-layer masking structure.

In some embodiments, a process for forming the first masking layer 1102 comprises depositing the first masking layer 1102 over the metal grid layer 112, the upper metal structure 124, and the plurality of elongated metal segments 1002. The first masking layer 1102 may be depositing by, for example, a spin-on process, a spray coating process, CVD, PVD, some other deposition process, or a combination of the foregoing. The first masking layer 1102 may be or comprise, for example, a photoresist material, an anti-reflective material, spin-on carbon, or the like. As shown in the cross-sectional view 1100a of FIG. 11A and the perspective view 1100b of FIG. 11B, in some embodiments, the first masking layer 1102 is formed with a substantially planar upper surface.

In some embodiments, a process for forming the second masking layer 1104 comprises depositing the second masking layer 1104 on the first masking layer 1102. The second masking layer 1104 may be depositing by, for example, a spin-on process, CVD, PVD, ALD, some other deposition process, or a combination of the foregoing. The second masking layer 1104 may be or comprise, for example, an oxide (e.g., $SiO_2$), a nitride (e.g., SiN), an oxy-nitride (e.g., silicon oxynitride ($SiO_XN_Y$)), a spin-on glass, a silicon-containing material, or the like. In some embodiments, the second masking layer 1104 is formed with a substantially planar upper surface.

In some embodiments, a process for forming the patterned masking layer 1106 comprises forming a third masking layer (not shown) (e.g., positive/negative photoresist material) on the second masking layer 1104 (e.g., via a spin-on process). Thereafter, the third masking layer is exposed to a pattern by a lithography process (e.g., photolithography, extreme ultraviolet lithography, or the like). The third masking layer is the developed (e.g., by applying a developer agent to the masking layer), thereby forming the patterned masking layer 1106 over the second masking layer 1104. In some embodiments, the patterned masking layer 1106 is formed with a thickness that is less than the thickness in which the first masking layer 1102 is formed.

Figure 12A:
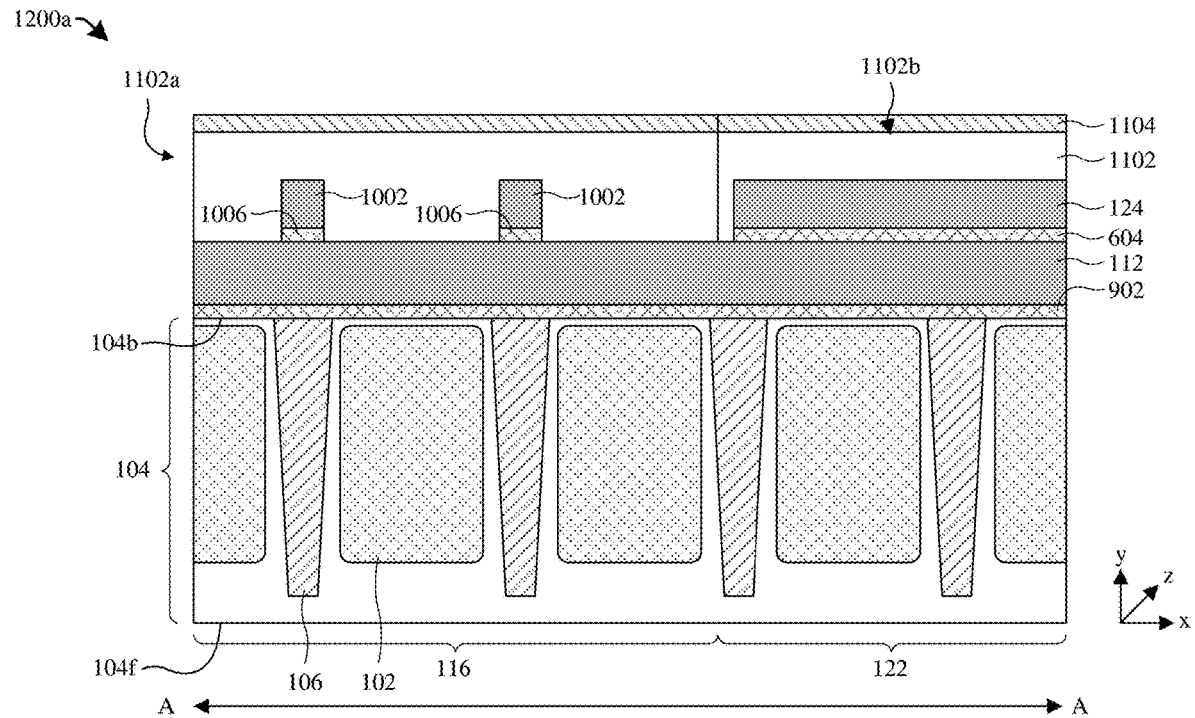
Figure 12B:
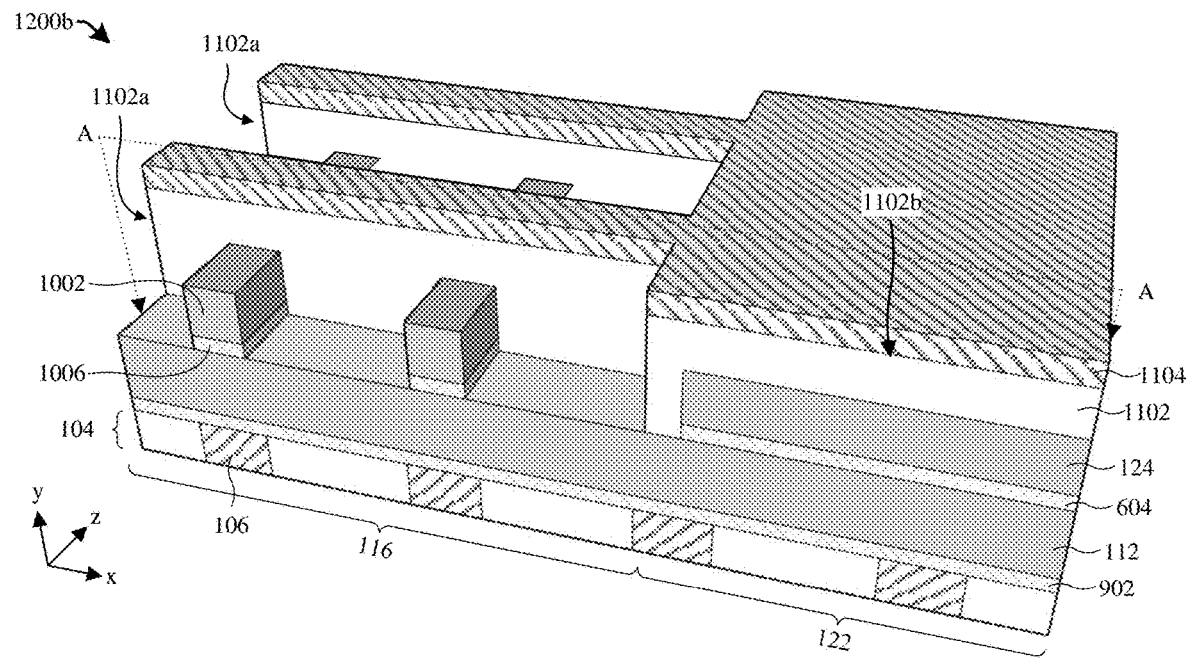

As shown in cross-sectional view 1200a of FIG. 12A and perspective view 1200b of FIG. 12B, the pattern of the patterned masking layer 1106 (see, FIGS. 11A-11B) is transferred to the second masking layer 1104 and the first masking layer 1102. The pattern of the patterned masking layer 1106 is transferred to the second masking layer 1104 and the first masking layer 1102 via an etching process. For example, with the patterned masking layer 1106 in place over the second masking layer 1104, the etching process is performed on the first masking layer 1102 and the second masking layer 1104, thereby selectively removing unmasked portions of the first masking layer 1102 and the second masking layer 1104. The etching process may be, for example, a dry etching process, a RIE process, a wet etching process, some other etching process, or a combination of the foregoing. The patterned masking layer 1106 is subsequently stripped away.

Because the pattern from the patterned masking layer 1106 is transferred to the first masking layer 1102, the first masking layer 1102 has a plurality of elongated masking portions 1102a and a peripheral masking portion 1102b after the etching process. In other words, the patterned masking layer 1106 had corresponding elongated portions and a corresponding peripheral masking portion that is transferred to the first masking layer 1102 via the etching process. The plurality of elongated masking portions 1102a overlies the central the pixel region 116 of the semiconductor substrate 104. The peripheral masking portion 1102b overlies the peripheral pixel region 122 of the semiconductor substrate 104. In some embodiments, after the etching process, the second masking layer 1104 has substantially the same layout as the first masking layer 1102.

The plurality of elongated masking portions 1102a are arranged in parallel with one another and extend laterally in a first direction (along the z-axis). In some embodiments, the peripheral masking portion 1102b extends laterally in a closed loop path, such that the peripheral masking portion 1102b laterally encloses the plurality of elongated masking portions 1102a. In some embodiments, the peripheral masking portion 1102b has a ring-like layout (e.g., a square ring-like layout). In such embodiments, the peripheral masking portion 1102b may be referred to as a ring-like masking portion of the first masking layer 1102. The elongated masking portions 1102a extend continuously between opposites inner sidewalls of the ring-like masking portion of the first masking layer 1102. In other words, the first masking layer 1102 is a continuous layer, and both the peripheral masking portion 1102b and the plurality of elongated masking portions 1102a are portions of the continuous layer. In some embodiments, the peripheral masking portion 1102b covers inner sidewalls of the upper metal structure 124 and inner sidewalls of the second masking structure 604. In such embodiments, the peripheral masking portion 1102b extends vertically along the inner sidewalls of the upper metal structure 124 and the inner sidewalls of the second masking structure 604 to an upper surface of the metal grid layer 112.

Figure 13A:
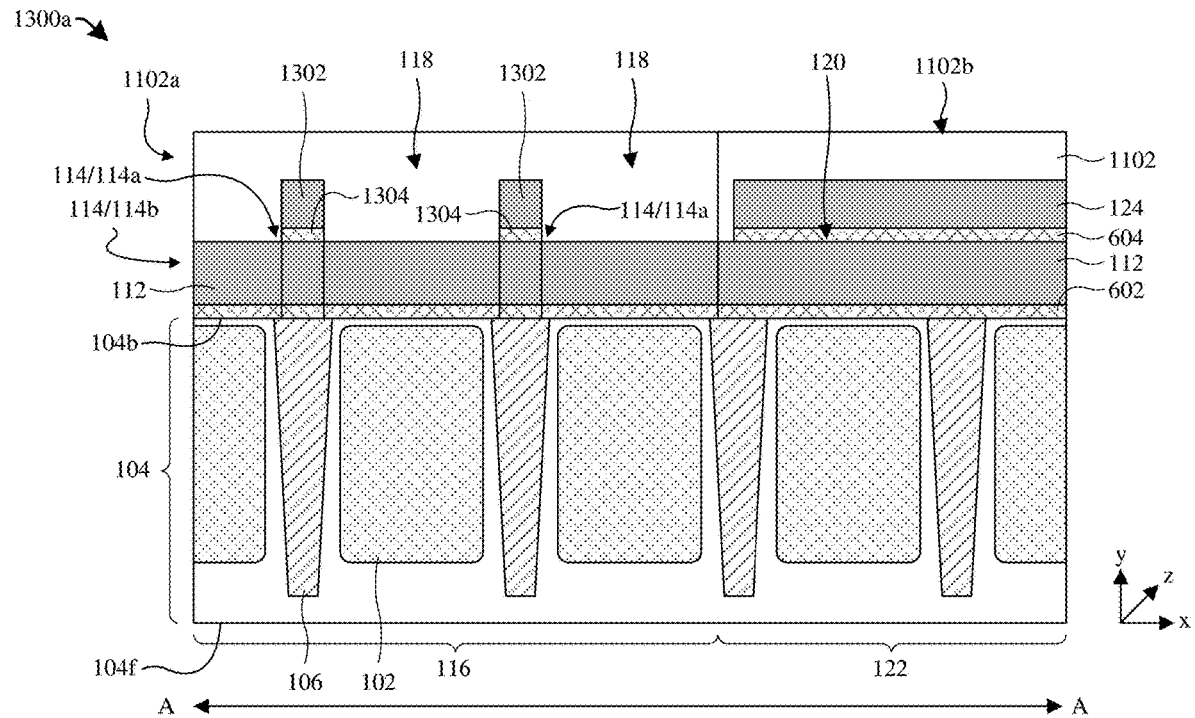
Figure 13B:
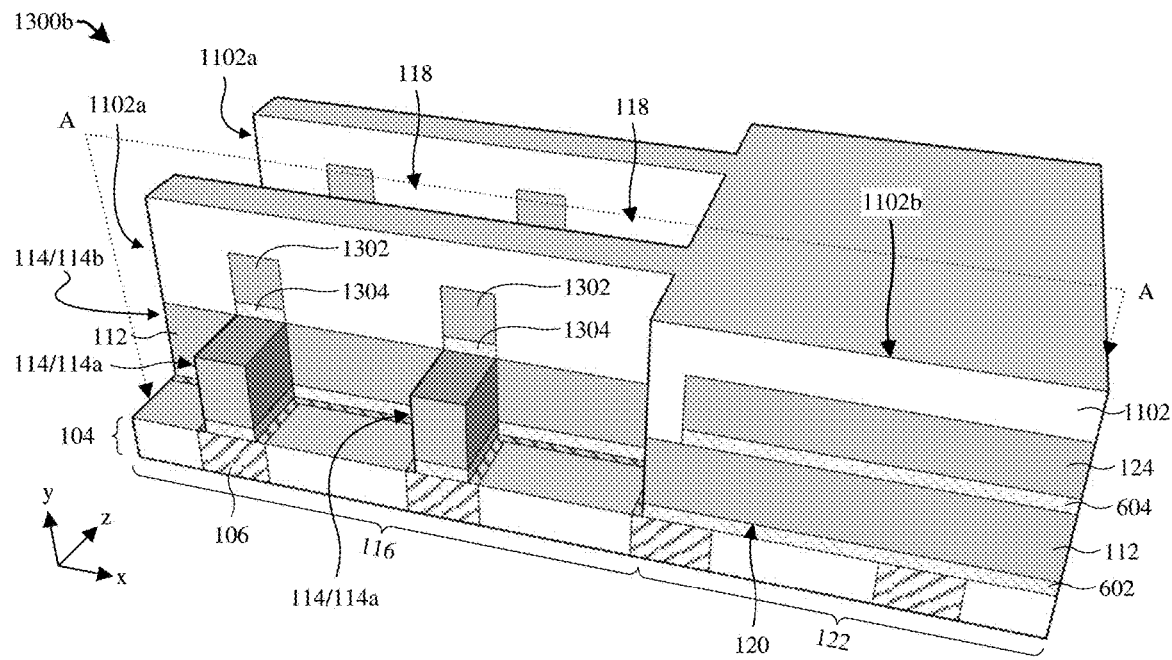

As shown in cross-sectional view 1300a of FIG. 13A and perspective view 1300b of FIG. 13B, the metal grid layer 112 is etched via a first etching process (e.g., anisotropic etching process) so that the metal grid layer 112 comprises a metal grid structure 114 overlying the central pixel region 116 and a peripheral metal structure 120 overlying the peripheral pixel region 122. The first etching process is performed with the first masking layer 1102 in place over the metal grid layer 112, the plurality of elongated metal segments 1002 (see, FIGS. 12A-12B), and the upper metal structure 124, thereby selectively etching the metal grid layer 112 according to the first masking layer 1102. Further, the plurality of elongated metal segments 1002 act as masking structures during the first etching process, such that the first etching process also selectively etches the metal grid layer 112 according to the plurality of elongated metal segments 1002. The first etching process removes unmasked portions of the metal grid layer 112 (e.g., not covered by either the first masking layer 1102 or the plurality of elongated metal segments 1002), thereby forming the metal grid structure 114 and the peripheral metal structure 120. In other words, the first etching process etches the metal grid layer 112 according to the first masking layer 1102 and the plurality of elongated metal segments 1002, thereby defining a metal grid structure 114 and a peripheral metal structure 120 over the semiconductor substrate 104.

In some embodiments, the first etching process may be, for example, a dry etching process, a reactive ion etching (RIE) process, a wet etching process, some other etching process, or a combination of the foregoing. In further embodiments, the first etching process is a dry etching process (or a RIE process) that has a chlorine-based etch chemistry (e.g., $Cl_2/Ar$, or the like).

As shown in the cross-sectional view 1300a of FIG. 13A and the perspective view 1300b of FIG. 13B, metal remnant structures 1302 of the plurality of elongated metal segments 1002 remain over the metal grid structure 114 after the first etching process. The metal remnant structures 1302 are portions of the plurality of elongated metal segments 1002 that remain over the metal grid structure 114 after the first etching process. The metal remnant structures 1302 remain over the metal grid structure 114 because the first masking layer 1102 covers the portions of the plurality of elongated metal segments 1002 during the first etching process, and unlike the first masking layer 1102, the first etching process removes exposed portions of the plurality of elongated metal segments 1002 (e.g., due to the etch chemistry of the first etching process).

The metal grid structure 114 comprises a first plurality of elongated grid segments 114a and a second plurality of elongated grid segments 114b. The first plurality of elongated segments 114a are arranged in parallel with one another and extend laterally in the first direction (along the z-axis). The second plurality of elongated segments 114b are arranged in parallel with one another and extend laterally in a second direction (along the x-axis) that is orthogonal to the first direction. The first plurality of elongated segments 114a intersect the second plurality of elongated segments 114b and define a plurality of grid openings 118 that extend vertically through the metal grid structure 114. The first plurality of elongated segments 114a and the second plurality of elongated segments 114b intersect one another at intersection points (see, 302 of FIG. 3). The metal remnant structures 1302 are disposed over (e.g., directly over) the intersection points. In some embodiments, the metal remnant structures 1302 have a same layout (e.g., footprint) as the intersection points (e.g., square-like footprints).

In some embodiments, the peripheral pixel region 122 laterally encloses the central pixel region 116. The peripheral metal structure 120 extends laterally in a closed loop path, such that the peripheral metal structure 120 laterally encloses the metal grid structure 114. In some embodiments, the peripheral metal structure 120 has a ring-like layout (e.g., a square ring-like layout). Unlike the metal grid structure 114, the peripheral metal structure 120 does not have grid openings.

Also shown in the cross-sectional view 1300a of FIG. 13A and the perspective view 1300b of FIG. 13B, a first etch stop structure 602 is formed vertically between the metal grid layer 112 and the semiconductor substrate 104. The first etch stop structure 602 has substantially the same layout (e.g., footprint) as the metal grid structure 114 and the peripheral meal structure 120 of the metal grid layer 112.

In some embodiments, a process for forming the first etch stop structure 602 comprises performing a second etching process (e.g., anisotropic etching process) on the first etch stop layer 902 (see, FIGS. 12A-12B). The second etching process is performed on the first etch stop layer 902 with the first masking layer 1102 in place over the first plurality of elongated segments 114a, the metal remnant structures 1302, the second etch stop structure 604, the upper metal structure 124, and the peripheral metal structure 120, thereby selectively etching the first etch stop layer 902 according to the first masking layer 1102. Further, the first plurality of elongated grid segments 114a act as masking structures during the second etching process, such that the second etching process also selectively etches the first etch stop layer 902 according to the first plurality of elongated grid segments 114a. The second etching process removes unmasked portions of the first etch stop layer 902 (e.g., not covered by either the first masking layer 1102 or the first plurality of elongated grid segments 114a), thereby forming the first etch stop structure 602.

In some embodiments, the second etching process may be, for example, a dry etching process, a RIE process, a wet etching process, some other etching process, or a combination of the foregoing. In further embodiments, the second etching process is a dry etching process (or a RIE process) that has a fluorine-based etch chemistry (e.g., carbon tetrafluoride ($CF_4$), trifluoromethane ($CHF_3$), octafluorocyclobutane ($C_4F_8$), or the like).

As shown in the cross-sectional view 1300a of FIG. 13A and the perspective view 1300b of FIG. 13B, remnant structures 1304 of the plurality of elongated etch stop segments 1006 remain vertically between the metal remnant structures 1302 and the metal grid structure 114. The remnant structures 1304 of the plurality of elongated etch stop segments 1006 are portions of the plurality of elongated etch stop segments 1006 that remain between the metal remnant structures 1302 and the metal grid structure 114. The remnant structures 1304 of the plurality of elongated etch stop segments 1006 remain between the metal remnant structures 1302 and the metal grid structure 114 because the first masking layer 1102 covers the portions of the plurality of elongated etch stop segments 1006 during the second etching process, and unlike the first masking layer 1102, the second etching process removes exposed portions of the plurality of elongated etch stop segments 1006 (e.g., due to the etch chemistry of the second etching process).

The remnant structures 1304 of the plurality of elongated etch stop segments 1006 are disposed over (e.g., directly over) the points at which the first plurality of elongated segments 114a and the second plurality of elongated segments 114b intersect (e.g., the intersection points). The remnant structures 1304 of the plurality of elongated etch stop segments 1006 have a same layout (e.g., footprint) as the intersection points (e.g., square-like footprints). After the second etching process, the first masking layer 1102 may be stripped away.

Figure 14A:
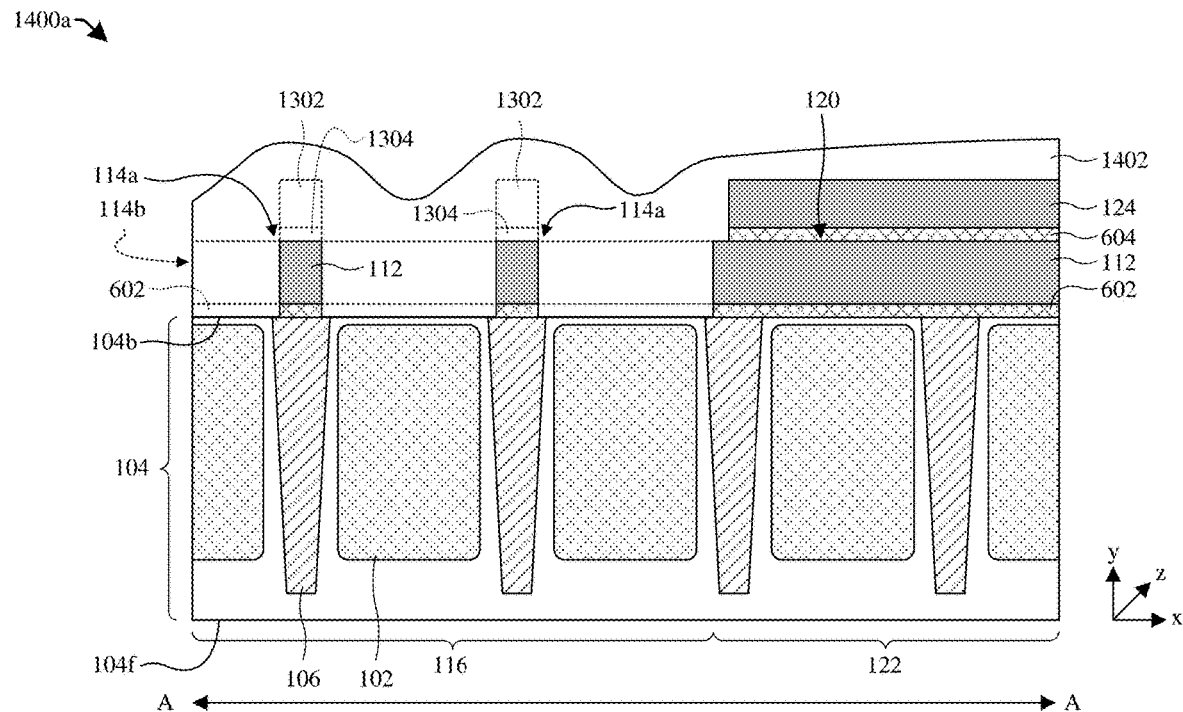
Figure 14B:
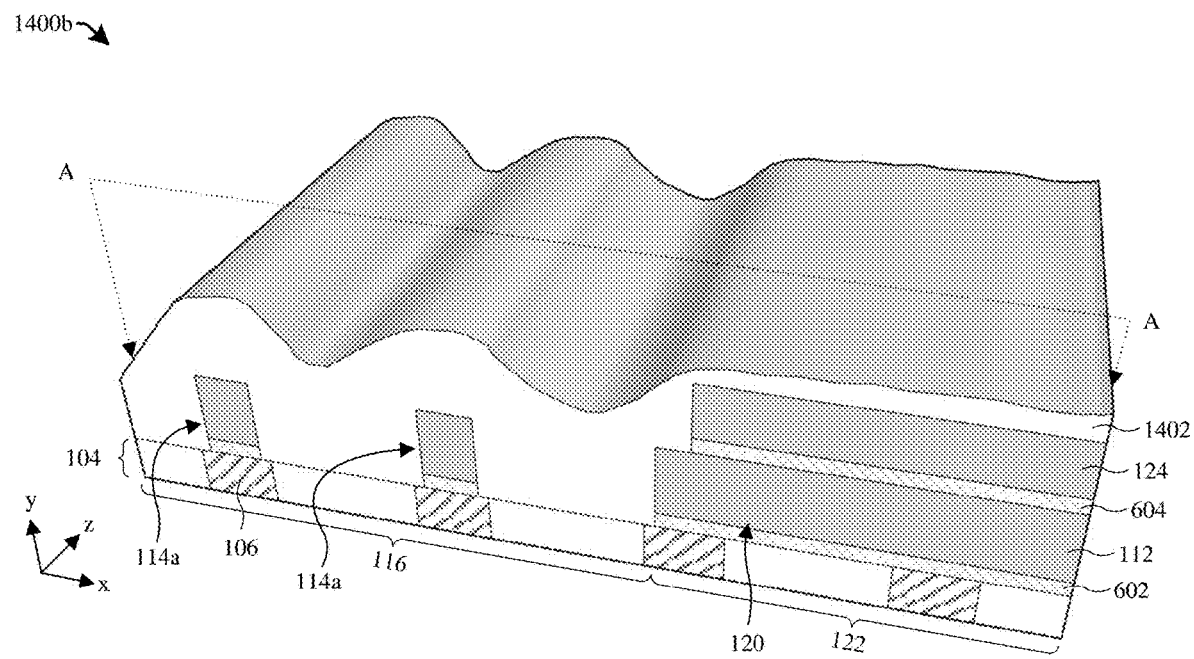

As shown in cross-sectional view 1400a of FIG. 14A and perspective view 1400b of FIG. 14B, a masking layer 1402 is formed over the semiconductor substrate 104, the first etch stop structure 602, the metal grid layer 112, the second etch stop structure 604, and the upper metal structure 124. The masking layer 1402 is also formed in the grid openings 118. The masking layer 1402 is formed with a nonplanar upper surface. The nonplanar upper surface of the masking layer 1402 corresponds to the topography of the structure illustrated in FIGS. 13A-13B after the first masking layer 1102 has been stripped away. The masking layer 1402 covers (e.g., completely covers) the first etch stop structure 602, the metal grid layer 112, the second etch stop structure 604, and the upper metal structure 124. For clarity in the figures, portions of the first etch stop structure 602, portions of the metal grid layer 112, portions of the metal remnant structures 1302, and portions of the remnant structures 1304 of the plurality of elongated etch stop segments 1006 that are covered by the masking layer 1402 are illustrated in phantom (e.g., via dotted lines) in the cross-sectional view 1400a of FIG. 14A.

In some embodiments, a process for forming the masking layer 1402 comprises depositing the masking layer 1402 on the semiconductor substrate 104, the first etch stop structure 602, the metal grid layer 112, the second etch stop structure 604, and the upper metal structure 124. The masking layer 1402 may be deposited by, for example, a spin-on process, a spray coating process, CVD, PVD, ALD, some other deposition process, or a combination of the foregoing. The masking layer 1402 may be or comprise, for example, a photoresist material, an anti-reflective material, spin-on carbon, or the like. In some embodiments, the masking layer is a bottom anti-reflective coating (BARC).

Figure 15A:
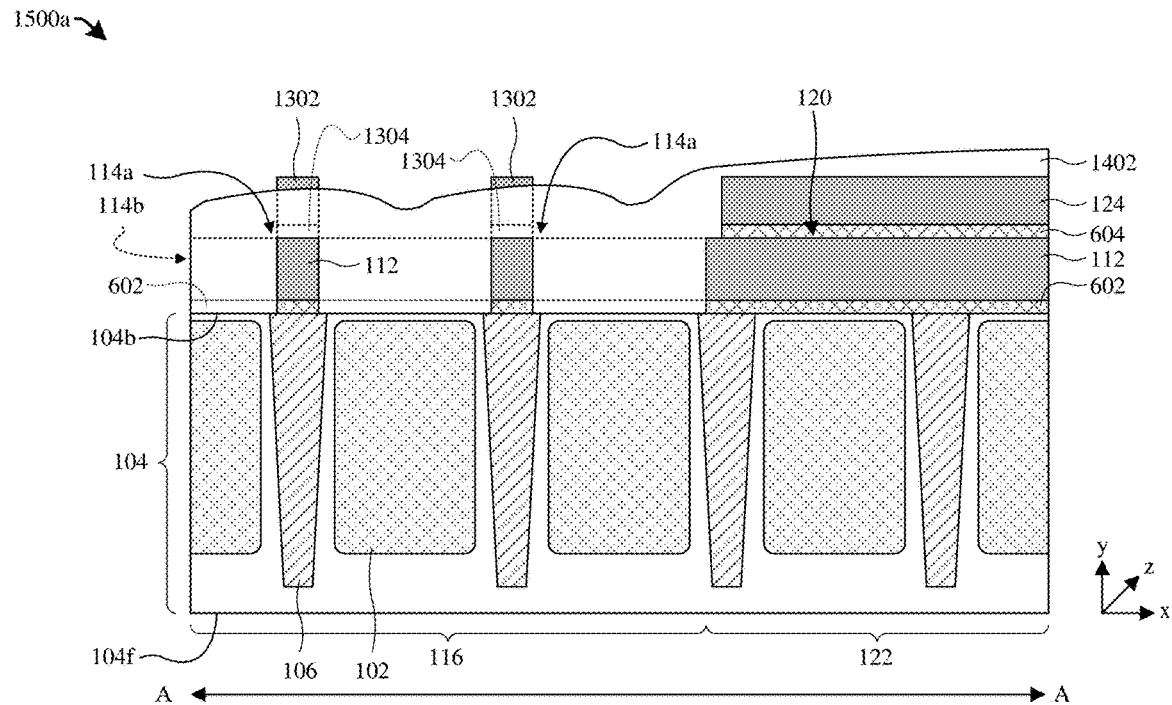
Figure 15B:
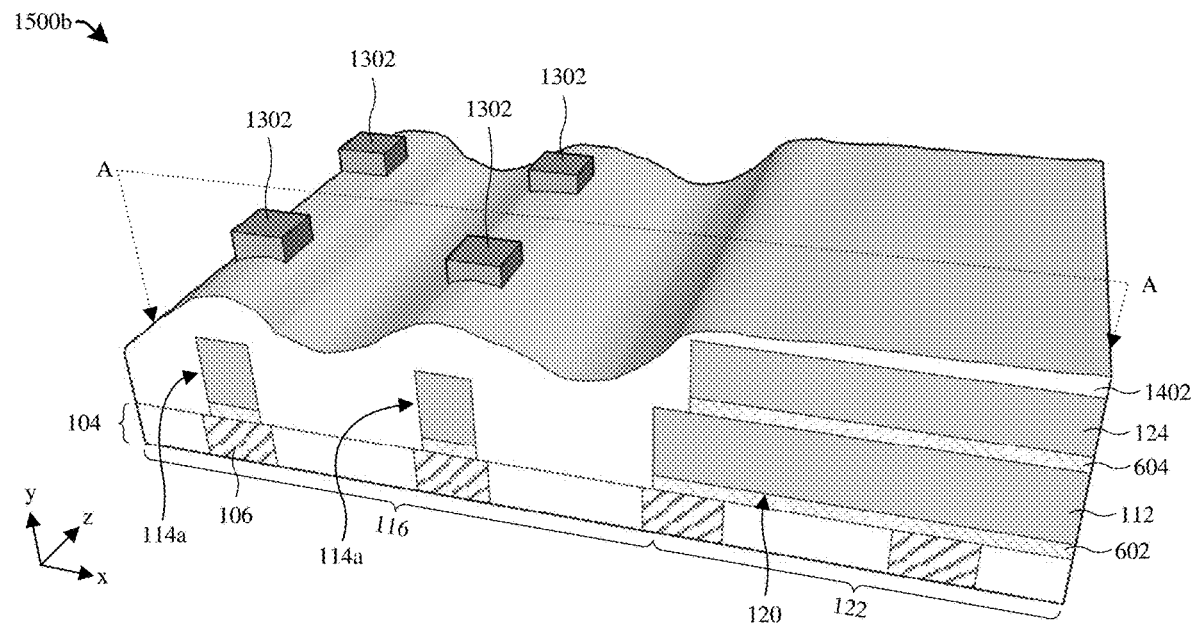

As shown in cross-sectional view 1500a of FIG. 15A and perspective view 1500b of FIG. 15B, a first etch back process is performed on the masking layer 1402, thereby removing an upper portion of the masking layer 1402. By removing the upper portion of the masking layer 1402, upper portions of the metal remnant structures 1302 are exposed. The first etch back process comprises performing an etching process on the masking layer 1402, thereby removing the upper portion of the masking layer 1402. In some embodiments, the etching process reduces a thickness of the masking layer 1402 over both the central pixel region 116 and the peripheral pixel region 122 of the semiconductor substrate 104. In other embodiments, the etching process may selectively remove portions of the masking layer 1402 disposed over the central pixel region 116 of the semiconductor substrate 104 (e.g., by forming a patterned masking layer over the masking layer 1402 prior to performing the etching process).

In some embodiments, the etching process may be, for example, a dry etching process, a RIE process, a wet etching process, some other etching process, or a combination of the foregoing. In further embodiments, the etching process is a dry etching process (or a RIE process). The etch chemistry of the etching process may be or comprise, for example, oxygen (e.g., oxygen gas ($O_2$)), nitrogen (e.g., nitrogen gas ($N_2$)), hydrogen (e.g., hydrogen gas ($H_2$)), some other suitable element, or a combination of the foregoing.

Figure 16A:
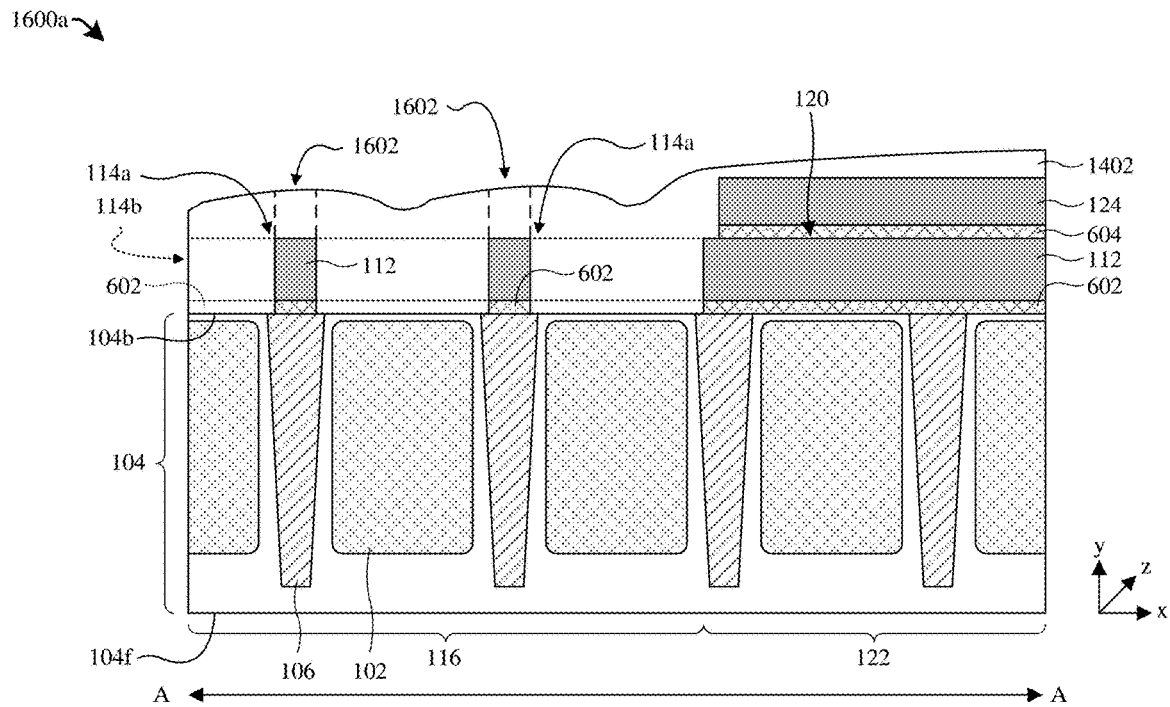
Figure 16B:
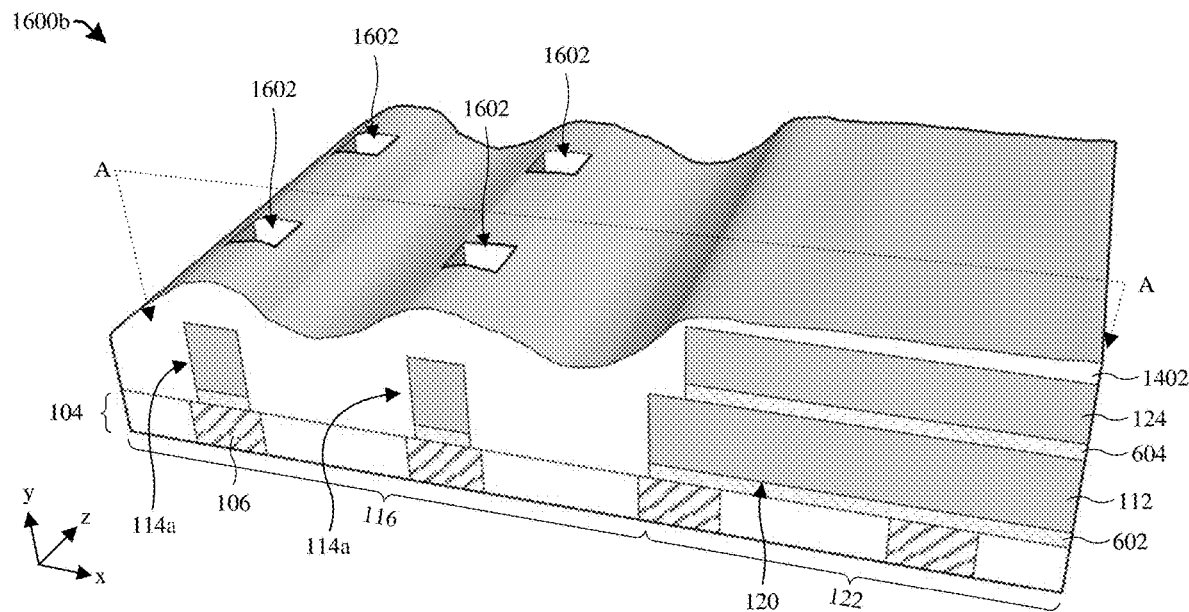

As shown in cross-sectional view 1600a of FIG. 16A and perspective view 1600b of FIG. 16B, a second etch back process is performed on the metal remnant structures 1302, thereby removing the metal remnant structures 1302 and the remnant structures 1304 of the plurality of elongated etch stop segments 1006 from above the metal grid structure 114. By removing the metal remnant structures 1302 and the remnant structures 1304 of the plurality of elongated etch stop segments 1006, a plurality of openings 1602 are formed within the masking layer 1402. For clarity in the figures, the plurality of openings are illustrated in phantom (e.g., via dotted lines) in the cross-sectional view 1600a of FIG. 16A.

The second etch back process comprises performing a first etching process on the metal remnant structures 1302. The first etching process is more selective to the metal remnant structures 1302 than the masking layer 1402. As such, the first etching process selectively removes the metal remnant structures 1302 (e.g., etches back the metal remnant structures 1302). In some embodiments, the first etching process may be, for example, a dry etching process, a RIE process, a wet etching process, some other etching process, or a combination of the foregoing. In further embodiments, the first etching process is a dry etching process (or a RIE process) that has a chlorine-based etch chemistry (e.g., $Cl_2$/Ar, or the like).

Thereafter, a second etching process is performed to remove the remnant structures 1304 of the plurality of elongated etch stop segments 1006. Like the first etching process, the second etching process is more selective to the remnant structures 1304 of the plurality of elongated etch stop segments 1006 than the masking layer 1402. As such, the second etching process selectively removes the remnant structures 1304 of the plurality of elongated etch stop segments 1006. In some embodiments, the second etching process may be, for example, a dry etching process, a RIE process, a wet etching process, some other etching process, or a combination of the foregoing. In further embodiments, the second etching process is a dry etching process (or a RIE process) that has a fluorine-based etch chemistry (e.g., carbon tetrafluoride ($CF_4$), trifluoromethane ($CHF_3$), octafluorocyclobutane ($C_4F_8$), or the like).

In some embodiments, the second etching process may not remove all of the remnant structures 1304 of the plurality of elongated etch stop segments 1006, thereby leaving etch stop remnant structures 702 (see, e.g., FIG. 7) over the metal grid layer 114 (e.g., directly over the intersection points 302). In other embodiments, the second etching process may remove an upper portion of the metal grid layer 114, such that the points that the first plurality of elongated segments 114a and the second plurality of elongated segments 114b intersect (e.g., intersection points 302) have an upper surface that is disposed beneath upper surfaces of the first plurality of elongated segments 114a and the second plurality of elongated segments 114b (see, e.g., FIG. 3). In embodiments in which the second etch stop layer 904 (see, e.g., FIGS. 9A-9B) is omitted, the first etching process may not remove all of the metal remnant structures 1302, such that the points that the first plurality of elongated segments 114a and the second plurality of elongated segments 114b intersect (e.g., intersection points 302) have an upper surface that is disposed over upper surfaces of the first plurality of elongated segments 114a and the second plurality of elongated segments 114b (see, e.g., FIG. 4). In other embodiments in which the second etch stop layer 904 (see, e.g., FIGS. 9A-9B) is omitted, the first etching process may remove an upper portion of the metal grid layer 114, such that the points that the first plurality of elongated segments 114a and the second plurality of elongated segments 114b intersect (e.g., intersection points 302) have an upper surface that is disposed beneath upper surfaces of the first plurality of elongated segments 114a and the second plurality of elongated segments 114b (see, e.g., FIG. 3).

The upper surface of the intersection points 302 being above or below the upper surfaces of the first plurality of elongated segments 114a and the second plurality of elongated segments 114b, and the etch stop remnant structures 702 being disposed over the metal grid layer 114 at the intersection points 302 indicate that the structure illustrated in FIGS. 17A-17B may have been formed in the above described manner (e.g., due to the above method utilizing a second etch back process to remove the metal remnant structures 1302 and the remnant structures 1304 of the plurality of elongated etch stop segments 1006). In yet other embodiments, the second etching process (or the first etching process) stop directly at the upper surface of the first plurality of elongated segments 114a and the second plurality of elongated segments 114b, such that the points that the first plurality of elongated segments 114a and the second plurality of elongated segments 114b intersect (e.g., intersection points 302) have an upper surface that is substantially co-planar with the upper surfaces of the first plurality of elongated segments 114a and the second plurality of elongated segments 114b.

By forming the metal grid structure 114 in the above described manner (e.g., by forming the metal grid layer 112 according to the first masking layer 1102 and the plurality of elongated metal segments 1002) and then etching back the metal remnant structures 1302 (and the remnant structures 1304 of the plurality of elongated etch stop segments 1006), the first plurality of elongated grid segments 114a and the second plurality of elongated grid segments 114b may intersect each other at substantially right angles, such that the grid openings 118 are rectangular when viewed from above. Further, this prevents the presence of remnants of the metal grid layer 112, which are present on typical metal grid structures, from extending between adjacent first and second elongated grid segments, thereby mitigating the reflection of incident light away from the plurality of photodetectors 102. Thus, a QE of the plurality of photodetectors 102 may be increased.

In some embodiments, the typical metal grid structures comprises remnants of the metal grid layer extending between adjacent first and second elongated grid segments due to the typical metal grid structures being formed by other methods that suffer from intrinsic optical resolution effects and/or etching effects. For example, the typical metal grid structures are typically patterned by one mask of lithography. Light diffraction may cause pattern distortion at the intersection of adjacent lines. As such, although the mask pattern has straight sidewalls, the photoresist pattern might have curved sidewalls. In addition, a distortion might also occur at the intersection due to an etching process.

Figure 17A:
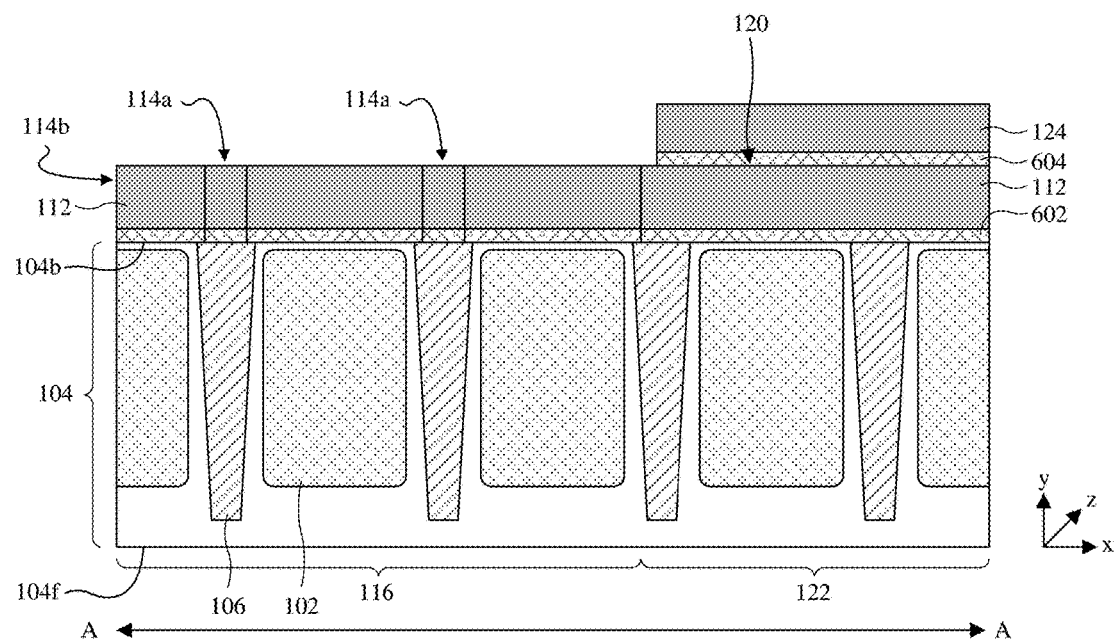
Figure 17B:
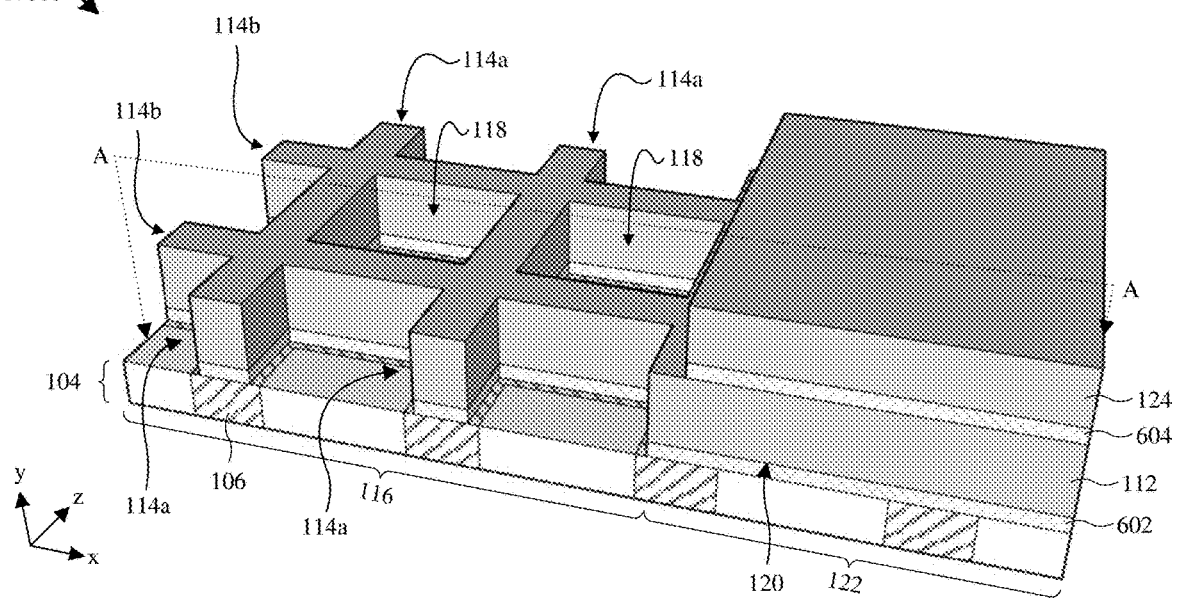

As shown in cross-sectional view 1700a of FIG. 17A and perspective view 1700b of FIG. 17B, the masking layer 1402 is stripped away. After the masking layer 1402 is stripped away, the first etch stop structure 602 is disposed over the semiconductor substrate 104. The metal grid layer 112, which comprises the metal grid structure 114 and the peripheral metal structure 120, is disposed over the semiconductor substrate 104 and the first etch stop structure 602. The second etch stop structure 604 is disposed over the semiconductor substrate 104 and the peripheral metal structure 120 of the metal grid layer 112, and the upper metal structure 124 overlies the second etch stop structure 604.

Figure 18:
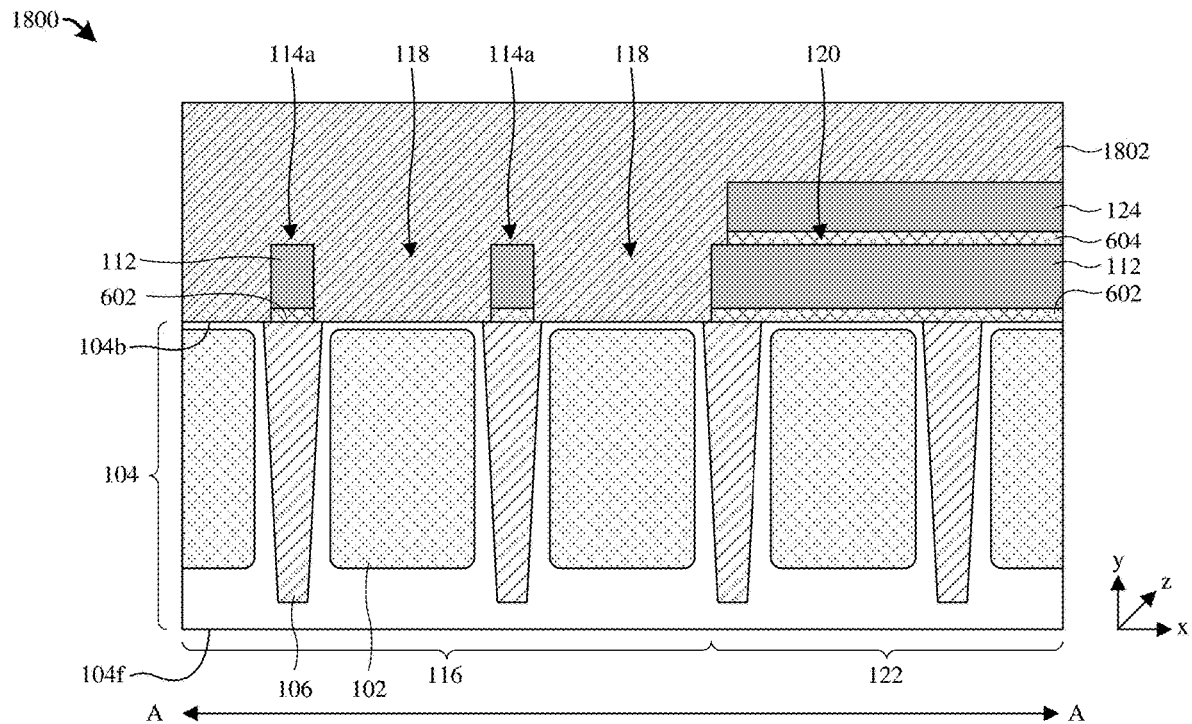

As shown in cross-sectional view 1800 of FIG. 18, a light filter grid layer 1802 is formed over the semiconductor substrate 104, the first etch stop structure 602, the metal grid layer 112, the second etch stop structure 604, and the upper metal structure 124. The light filter grid layer 1802 may also be formed within the grid openings 118. In some embodiments, a process for forming the light filter grid layer 1802 comprises depositing the light filter grid layer 1802 onto the semiconductor substrate 104, the first etch stop structure 602, the metal grid layer 112, the second etch stop structure 604, and the upper metal structure 124 by, for example, CVD, PVD, ALD, sputtering, some other deposition process, or a combination of the foregoing. In some embodiments, the light filter grid layer 1802 may comprise, for example, an oxide (e.g., $SiO_2$), a nitride (e.g., SiN), an oxy-nitride (e.g., $SiO_XN_Y$), or the like.

As shown in cross-sectional view 1900 of FIG. 19, a light filter grid structure 110 is formed over the semiconductor substrate 104 and the metal grid structure 114. The light filter grid structure 110 comprises a plurality of light filter grid openings that are disposed in an array comprising rows and columns. Also shown in the cross-sectional view 1900 of FIG. 19, a plurality of light filters 108 are formed in the plurality of light filter grid openings and in the plurality of grid openings 118.

In some embodiments, a process for forming the light filter grid structure 110 and the plurality of light filters 108 comprises selectively etching the light filter grid layer 1802 (see, FIG. 18). The light filter grid layer 1802 may be selectively etched by forming a pattered masking layer (not shown) on the light filter grid layer 1802 and subsequently performing an etching process on the light filter grid layer 1802 to remove unmasked portions of the light filter grid layer 1802, thereby forming the light filter grid structure 110 with the plurality of light filter grid openings. In some embodiments, the masking layer is subsequently stripped away.

Thereafter, the plurality of light filters 108 are formed in the plurality of light filter grid openings and the grid openings 118. In some embodiments, a process for forming the plurality of light filters 108 comprises depositing (e.g., via CVD, PVD, ALD, sputtering, a spin-on process, etc.) a light filtering material(s) into the plurality of light filter grid openings and the grid openings 118, thereby forming the plurality of light filters 108. The light filtering material(s) is a material that allows for the transmission of radiation (e.g., light) having a specific wavelength range, while blocking light of wavelengths outside of the specified range. Subsequently, in some embodiments, a planarization process (e.g., chemical-mechanical planarization (CMP)) may be performed on the plurality of light filters 108 to planarize upper surfaces of the plurality of light filters 108.

Also shown in the cross-sectional view 1900 of FIG. 19, a dielectric structure 126 is formed over the semiconductor substrate 104, the first etch stop structure 602, the peripheral metal structure 120, the second etch stop structure 604, and the upper metal structure 124. In some embodiments, the dielectric structure 126 is a portion of the light filter grid layer 1802, and is formed by a same process as the light filter grid structure 110. In other embodiments, the dielectric structure 602 may be formed by a different process than the light filter grid structure 110. For example, in some embodiments, the dielectric structure 126 may be or comprise a different material than the light filter grid structure 110. In such embodiments, a dielectric layer may be deposited (e.g., via CVD, PVD, ALD, sputtering, a spin-on process, etc.) over the plurality of light filters 108, the light filter grid structure 110, and the upper metal structure 124. Thereafter, the dielectric layer may be selectively etched and/or planarized (e.g., via CMP) to selectively remove portions of the dielectric layer, thereby forming the dielectric structure 126.

As shown in cross-sectional view 2000 of FIG. 20, a plurality of micro-lens 802 are formed over the plurality of light filters 108. The plurality of micro-lens 802 may be formed by depositing a micro-lens material on the light filter grid structure 110, the plurality of light filters 108, and on the dielectric structure 126 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The plurality of micro-lens 802 are then formed by selectively etching the micro-lens material according to the micro-lens template. In some embodiments, after the plurality of micro-lens 802 are formed, formation of the image sensor having the metal grid structure 114 that improves the QE of a plurality of photodetectors 102 is complete.

Figure 21:
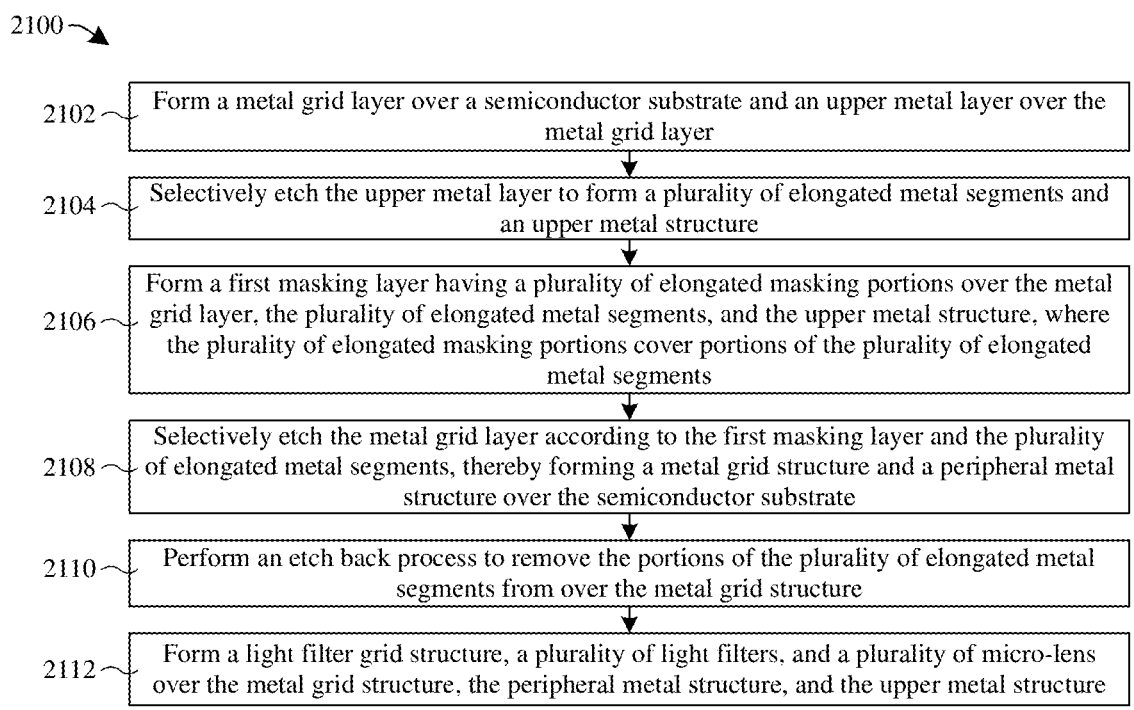
FIG. 21 illustrates a flowchart of some embodiments of a method for forming an image sensor having a metal grid structure that improves the QE of a plurality of photodetectors.

FIG. 21 illustrates a flowchart 2100 of some embodiments of a method for forming an image sensor having a metal grid structure 114 that improves the QE of a plurality of photodetectors 102. While the flowchart 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2102, a metal grid layer is formed over a semiconductor substrate and an upper metal layer is formed over the metal grid layer. FIGS. 9A-9B illustrates various views 900a-900b of some embodiments corresponding to act 2102.

At act 2104, the upper metal layer is selectively etched to form a plurality of elongated metal segments and an upper metal structure. FIGS. 10A-10B illustrates various views 1000a-1000b of some embodiments corresponding to act 2104.

At act 2106, a first masking layer having a plurality of elongated masking portions is formed over the metal grid layer, over the plurality of elongated metal segments, and over the upper metal structure, where the plurality of elongated masking portions cover portions of the plurality of elongated metal segments. FIGS. 11A-11B through 12A-12B illustrate a series of various views of some embodiments corresponding to act 2106.

At act 2108, the metal grid layer is selectively etched according to the first masking layer and the plurality of elongated metal segments, thereby forming a metal grid structure and a peripheral metal structure over the semiconductor substrate. FIGS. 13A-13B illustrates various views 1300a-1300b of some embodiments corresponding to act 2108.

At act 2110, an etch back process is performed to remove the portions of the plurality of elongated metal segments from over the metal grid structure. FIGS. 14A-14B through 17A-17B illustrate a series of various views of some embodiments corresponding to act 2110.

At act 2112, a light filter grid structure, a plurality of light filters, and a plurality of micro-lens are formed over the metal grid structure, the peripheral metal structure, and the upper metal structure. FIGS. 18-20 illustrate a series of various views of some embodiments corresponding to act 2112.

In some embodiments, the present application provides a method for forming a semiconductor device. The method comprises forming photodetectors within a semiconductor substrate, wherein the semiconductor substrate comprises a first surface opposite a second surface. A metal grid layer is formed over the first surface of the semiconductor substrate. An upper metal layer is formed over the metal grid layer. A first etching process is performed on the upper metal layer to define a plurality of elongated metal segments over the metal grid layer, wherein the elongated metal segments are arranged in parallel with one another and extend continuously in a first direction. A first masking layer is formed over the plurality of elongated metal segments such that the first masking layer comprises a plurality of elongated masking segments, wherein the elongated masking segments are arranged in parallel with one another and extend continuously in a second direction orthogonal to the first direction. A second etching process is performed on the metal grid layer according to the first masking layer and the plurality of elongated metal segments to define a metal grid structure and a plurality of grid openings over the photodetectors.

In some embodiments, the present application provides an image sensor. The image sensor comprises a semiconductor substrate comprising a first surface opposite a second surface. A plurality of photodetectors are disposed within the semiconductor substrate. A metal grid layer overlies the first surface of the semiconductor substrate, wherein the metal grid layer comprises a metal grid structure overlying a central pixel region of the semiconductor substrate, wherein the metal grid layer continuously extends from the central pixel region to a peripheral pixel region of the semiconductor substrate that laterally encloses the central pixel region. An upper metal structure is disposed over the metal grid layer, wherein the upper metal structure overlies the peripheral pixel region, wherein the upper metal structure is laterally offset from the metal grid structure, and wherein a lower surface of the upper metal structure is disposed vertically over an upper surface of the metal grid structure.

In some embodiments, the present application provides a method for forming a semiconductor device. The method comprises forming a metal grid layer over a semiconductor substrate, wherein a plurality of photodetectors are disposed in the semiconductor substrate. A plurality of elongated metal segments and a ring-like upper metal structure are formed over the metal grid layer, wherein the ring-like upper metal structure laterally surrounds the plurality of elongated metal segments and the plurality of elongated metal segments extend laterally between opposite sides of the ring-like upper metal structure in a first direction. A first masking structure is formed over the plurality of elongated metal segments and over the ring-like upper metal structure, wherein the first masking structure comprises a ring-like masking segment that overlies the ring-like upper metal structure, and wherein the first masking structure comprises a plurality of elongated masking segments that are arranged in parallel with one another and extend continuously between opposites sides of the ring-like masking segment in a second direction orthogonal to the first direction. A first etching process is performed on the metal grid layer according to the first masking structure and the plurality of elongated metal segments to define a metal grid structure and a ring-like peripheral metal structure over the semiconductor substrate, wherein the ring-like peripheral metal structure laterally surrounds the metal grid structure and is disposed vertically between the ring-like upper metal structure and the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming photodetectors within a semiconductor substrate, wherein the semiconductor substrate comprises a first surface opposite a second surface;
   forming a metal grid layer over the first surface of the semiconductor substrate;
   forming an upper metal layer over the metal grid layer;
   performing a first etching process on the upper metal layer to define a plurality of elongated metal segments over the metal grid layer, wherein the elongated metal segments are arranged in parallel with one another and extend continuously in a first direction;
   forming a first masking layer over the plurality of elongated metal segments such that the first masking layer comprises a plurality of elongated masking segments, wherein the elongated masking segments are arranged in parallel with one another and extend continuously in a second direction orthogonal to the first direction; and
   performing a second etching process on the metal grid layer according to the first masking layer and the plurality of elongated metal segments to define a metal grid structure and a plurality of grid openings over the photodetectors.

2. The method of claim 1, further comprising:
   forming a plurality of light filters within the plurality of grid openings.

3. The method of claim 2, further comprising:
   forming a plurality of micro-lenses over the plurality of light filters.

4. The method of claim 1, wherein the metal grid layer and the upper metal layer comprise a same material.

5. The method of claim 1, wherein:
   after etching the metal grid layer, portions of the elongated metal segments remain over the metal grid structure; and
   the portions of the elongated metal segments are removed from the metal grid structure via an etch back process.

6. The method of claim 5, wherein the etch back process comprises:
   forming a second masking layer over the metal grid structure, over the portions of the elongated metal segments, and in the plurality of grid opening;
   removing an upper portion of the second masking layer, thereby exposing the portions of the elongated metal segments; and
   with the second masking layer in place and after the portions of the elongated metal segments are exposed, performing a third etching process on the portions of the elongated metal segments.

7. The method of claim 5, wherein the metal grid structure comprises:
   a plurality of first elongated grid segments that are parallel with one another and each extend in the first direction; and
   a plurality of second elongated grid segments that are parallel with one another and each extend in the second direction, wherein the first elongated grid segments intersect the second elongated grid segments at a plurality of intersection points, and wherein the portions of the elongated metal segments are disposed over the plurality of intersection points, respectively.

8. A method for forming a semiconductor device, the method comprising:
   forming a metal grid layer over a semiconductor substrate, wherein a plurality of photodetectors are disposed in the semiconductor substrate;
   forming a plurality of elongated metal segments and a ring-like upper metal structure over the metal grid layer, wherein the ring-like upper metal structure laterally surrounds the plurality of elongated metal segments and the plurality of elongated metal segments extend laterally between opposite sides of the ring-like upper metal structure in a first direction;
   forming a first masking structure over the plurality of elongated metal segments and over the ring-like upper metal structure, wherein the first masking structure comprises a ring-like masking segment that overlies the ring-like upper metal structure, and wherein the first masking structure comprises a plurality of elongated masking segments that are arranged in parallel with one another and extend continuously between opposites sides of the ring-like masking segment in a second direction orthogonal to the first direction; and
   performing a first etching process on the metal grid layer according to the first masking structure and the plurality of elongated metal segments to define a metal grid structure and a ring-like peripheral metal structure over the semiconductor substrate, wherein the ring-like peripheral metal structure laterally surrounds the metal grid structure and is disposed vertically between the ring-like upper metal structure and the semiconductor substrate.

9. The method of claim 8, wherein forming the plurality of elongated metal segments and the ring-like upper metal structure comprises:
   forming an upper metal layer over the metal grid layer;
   forming a second masking structure over the upper metal layer; and
   performing a second etching process on the upper metal layer according to the first masking structure.

10. The method of claim 8, wherein forming the first masking structure comprises:
    forming a first masking layer over the plurality of elongated metal segments and over the ring-like upper metal structure;
    forming a second masking layer over the first masking layer; and
    performing a second etching process on the first masking layer according to the second masking layer to transfer a pattern from the second masking layer to the first masking layer.

11. The method of claim 8, wherein the ring-like masking segment is formed covering inner sidewalls of the ring-like upper metal structure.

12. A method for forming an image sensor, comprising:
    providing a substrate comprising a first surface opposite a second surface;
    forming a plurality of photodetectors within the substrate;

forming a metal grid layer overlying the first surface of the substrate, wherein the metal grid layer comprises a metal grid structure overlying a central pixel region of the substrate and a peripheral metal structure overlying a peripheral pixel region of the substrate, and wherein the peripheral metal structure laterally encloses the metal grid structure; and forming an upper metal structure over the metal grid layer, wherein the upper metal structure overlies the peripheral metal structure and is laterally offset from the metal grid structure.

13. The method of claim 12, wherein the upper metal structure and the metal grid layer are formed with a same material.

14. The method of claim 12, further comprising:
forming a plurality of light filters overlying the photodetectors, wherein the metal grid structure laterally surrounds the plurality of light filters.

15. The method of claim 12, wherein:
the plurality of photodetectors are formed in both the central pixel region of the substrate and the peripheral pixel region of the substrate;
the metal grid structure extends between the photodetectors that are disposed in the central pixel region of the substrate; and
the peripheral metal structure covers the photodetectors that are disposed in the peripheral pixel region of the substrate.

16. The method of claim 12, wherein:
the peripheral metal structure is formed with a ring-like layout that laterally encloses the metal grid structure; and
the peripheral metal structure extends continuously from an inner sidewall of the peripheral metal structure to an outer sidewall of the peripheral metal structure; and
the outer sidewall of the peripheral metal structure extends laterally around the metal grid structure in a closed loop path.

17. The method of claim 12, wherein the upper metal structure if formed with a ring-like layout that laterally encloses the metal grid structure.

18. The method of claim 12, wherein the metal grid structure is formed by:
forming a first elongated grid segment that extends laterally in a first direction; and
forming a second elongated grid segment that extends laterally in a second direction that is orthogonal to the first direction; and
wherein the first elongated grid segment intersects the second elongated grid segment at an intersection point, and wherein an upper surface of the intersection point is vertically offset from both an upper surface of the first elongated grid segment and an upper surface of the second elongated grid segment.

19. The method of claim 18, wherein:
the upper surface of the intersection point has a square-like footprint.

20. The method of claim 18, wherein:
the upper surface of the first elongated grid segment is substantially co-planar with the upper surface of the second elongated grid segment.

* * * * *